(12) United States Patent
Slater, Jr. et al.

(10) Patent No.: US 6,791,119 B2
(45) Date of Patent: Sep. 14, 2004

(54) LIGHT EMITTING DIODES INCLUDING MODIFICATIONS FOR LIGHT EXTRACTION

(75) Inventors: David B. Slater, Jr., Raleigh, NC (US); Robert C. Glass, Chapel Hill, NC (US); Charles M. Swoboda, Morrisville, NC (US); Bernd Keller, Goleta, CA (US); James Ibbetson, Goleta, CA (US); Brian Thibeault, Santa Barbara, CA (US); Eric J. Tarsa, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/057,821

(22) Filed: Jan. 25, 2002

(65) Prior Publication Data

US 2002/0123164 A1 Sep. 5, 2002

Related U.S. Application Data

(60) Provisional application No. 60/307,235, filed on Jul. 23, 2001, and provisional application No. 60/265,707, filed on Feb. 1, 2001.

(51) Int. Cl.$^7$ .............................................. H01L 33/00
(52) U.S. Cl. .............................. 257/99; 257/95; 257/98
(58) Field of Search .............................. 257/95, 98, 99

(56) References Cited

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,006,908 A | 4/1991 | Matsuoka et al. | 357/17 |
| 5,027,168 A | 6/1991 | Edmond | 357/17 |
| 5,087,949 A | 2/1992 | Haitz | 357/17 |
| 5,187,547 A | 2/1993 | Niina et al. | 257/77 |
| 5,210,051 A | 5/1993 | Carter, Jr. | 437/107 |
| 5,237,182 A | 8/1993 | Kitagawa et al. | 257/15 |

(List continued on next page.)

FOREIGN PATENT DOCUMENTS

| | | |
|---|---|---|
| EP | 0 051 172 | 5/1982 |
| EP | 0 961 328 A2 | 12/1999 |
| EP | 1 168 460 A2 | 1/2002 |
| GB | 2 346 480 A | 8/2000 |
| JP | 56-131977 | 10/1981 |

(List continued on next page.)

OTHER PUBLICATIONS

OSRAM Enhances Brightness of Blue InGaN LEDs, Compound Semiconductor, vol. 7, No. 1, Feb. 2001, p. 7.

Craford, *Outlook for AlInGaP Technology*, Presentation, Strategies in Light 2000.

Krames et al., *High–Power Truncated–Inverted–Pyramid $(Al_xGa_{1-x})_{0.5}In_{0.5}P/GaP$ Light–Emitting Diodes Exhibiting > 55External Quantum Efficiency*, Applied Physics Letters, vol. 75, No. 16, Oct. 18, 1999, pp. 2365–2367.

(List continued on next page.)

*Primary Examiner*—Jerome Jackson
(74) *Attorney, Agent, or Firm*—Myers Bigel Sibley & Sajovec

(57) ABSTRACT

Light emitting diodes include a substrate having first and second opposing faces and that is transparent to optical radiation in a predetermined wavelength range and that is patterned to define, in cross-section, a plurality of pedestals that extend into the substrate from the first face towards the second face. A diode region on the second face is configured to emit light in the predetermined wavelength range, into the substrate upon application of voltage across the diode region. A mounting support on the diode region, opposite the substrate is configured to support the diode region, such that the light that is emitted from the diode region into the substrate, is emitted from the first face upon application of voltage across the diode region. The first face of the substrate may include therein a plurality of grooves that define the plurality of triangular pedestals in the substrate. The grooves may include tapered sidewalls and/or a beveled floor. The first face of the substrate also may include therein an array of via holes. The via holes may include tapered sidewalls and/or a floor.

104 Claims, 15 Drawing Sheets

U.S. PATENT DOCUMENTS

| | | | |
|---|---|---|---|
| 5,247,533 A | 9/1993 | Okazaki et al. | 372/45 |
| 5,338,994 A | 8/1994 | Lezan et al. | 307/86 |
| 5,369,289 A | 11/1994 | Tamaki et al. | 257/99 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,585,648 A | 12/1996 | Tischler | 257/77 |
| 5,604,135 A | 2/1997 | Edmond et al. | 437/22 |
| 5,631,190 A | 5/1997 | Negley | 438/33 |
| 5,718,760 A | 2/1998 | Carter et al. | 117/84 |
| 5,739,554 A | 4/1998 | Edmond et al. | 257/103 |
| 5,760,479 A | 6/1998 | Yang et al. | |
| 5,767,581 A | 6/1998 | Nakamura et al. | 257/749 |
| 5,777,350 A | 7/1998 | Nakamura et al. | 257/96 |
| 5,779,924 A | 7/1998 | Krames et al. | 216/24 |
| 5,846,694 A * | 12/1998 | Strand et al. | 430/321 |
| 5,912,477 A | 6/1999 | Negley | 257/95 |
| 5,917,202 A | 6/1999 | Haitz et al. | 257/98 |
| 5,952,681 A | 9/1999 | Chen | 257/89 |
| 6,015,719 A | 1/2000 | Kish, Jr. et al. | 438/29 |
| 6,031,243 A * | 2/2000 | Taylor | 257/98 |
| 6,046,465 A | 4/2000 | Wang et al. | 257/98 |
| 6,091,085 A | 7/2000 | Lester | 257/98 |
| 6,097,041 A | 8/2000 | Lin et al. | 257/98 |
| 6,118,259 A | 9/2000 | Bucks et al. | 323/312 |
| 6,120,600 A | 9/2000 | Edmond et al. | 117/89 |
| 6,121,636 A | 9/2000 | Morita et al. | 257/99 |
| 6,121,637 A | 9/2000 | Isokawa et al. | 257/99 |
| 6,133,589 A | 10/2000 | Krames et al. | 257/103 |
| 6,139,166 A | 10/2000 | Marshall et al. | 362/231 |
| 6,147,458 A | 11/2000 | Bucks et al. | 325/225 |
| 6,169,294 B1 | 1/2001 | Biing-Jye et al. | 257/79 |
| 6,177,688 B1 | 1/2001 | Linthicum et al. | 257/77 |
| 6,187,606 B1 | 2/2001 | Edmond et al. | 438/46 |
| 6,194,742 B1 | 2/2001 | Kern et al. | 257/94 |
| 6,201,264 B1 | 3/2001 | Khare et al. | 257/97 |
| 6,204,523 B1 | 3/2001 | Carey et al. | 257/98 |
| 6,222,207 B1 | 4/2001 | Carter-Coman et al. | 257/98 |
| 6,229,160 B1 | 5/2001 | Krames et al. | 257/94 |
| 6,455,878 B1 | 9/2002 | Bhat et al. | 257/99 |
| 2003/0006418 A1 | 1/2003 | Emerson et al. | 257/79 |
| 2003/0025212 A1 | 2/2003 | Bhat et al. | |

FOREIGN PATENT DOCUMENTS

| | | |
|---|---|---|
| JP | 61110476 | 5/1986 |
| JP | 1-225377 | 9/1989 |
| JP | 06-232510 | 8/1994 |
| JP | 07-235729 | 9/1995 |
| JP | 08-321660 | 12/1996 |
| JP | 9-82587 | 3/1997 |
| JP | 09-223846 | 8/1997 |
| JP | 10-163530 | 6/1998 |
| JP | 10-233549 | 9/1998 |
| JP | 10-256604 | 9/1998 |
| JP | 11-150302 A | 6/1999 |
| JP | 11-191641 | 7/1999 |
| JP | 11-220168 A | 8/1999 |
| JP | 2000-77713 A | 3/2000 |
| JP | 2000-195827 | 7/2000 |
| WO | WO 00/33365 | 6/2000 |
| WO | WO 01/47039 A1 | 6/2001 |

OTHER PUBLICATIONS

Lambrecht et al., *Band Structure Interpretation of the Optical Transitions Between Low–Lying Conduction Bands in n–Type Doped SiC Polytypes*, Materials Science Forum, vols. 264–268, 1998, pp. 271–274.

Craford, *Overview of Device Issues in High–Brightness Light–Emitting Diodes*, Chapter 2, *High Brightness Light Emitting Diodes: Semiconductors and Semimetals*, vol. 48, Stringfellow et al. ed., Academic Press, 1997, pp. 47–63.

Yoo et al., *Bulk Crystal Growth of 6H–SiC on Polytype–Controlled Substrates Through Vapor Phase and Characterization*, Journal of Crystal Growth, vol. 115, vol. 1991, pp. 733–739.

Biederman, *The Optical Absorption Bands and Their Anisotropy in the Various Modifications of SiC*, Solid State Communications, vol. 3, 1965, pp. 343–346.

U.S. application Ser. No. 09/154,363, entitled *Vertical Geometry InGaN LED*.

U.S. application Ser. No. 60/411,980, filed Sep. 19, 2002, *Phosphor–Coated Light Emitting Diodes Including Tapered Sidewalls, and Fabrication Methods*.

U.S. application Ser. No. 10/003,331, filed Oct. 31, 2001, *Low Temperature Formation of Backside Ohmic Contacts for Vertical Devices*.

U.S. application Ser. No. 60/294,445, filed May 30, 2001, *Multi–Quantum Well Light Emitting Diode Structure*.

U.S. application Ser. No. 60/294,378, filed May 30, 2001, *Light Emitting Diode Structure With Multi–Quantum Well and Superlattice Structure*.

U.S. application Ser. No. 60/294,308, filed May 30, 2001, *Light Emitting Diode Structure With Superlattice Structure*.

U.S. application Ser. No. 09/787,189, filed Mar. 15, 2001, *Low Temperature Formation of Backside Ohmic Contacts for Vertical Devices*.

Invitation to Pay Additional Fees, Annex to Form PCT/ISA/206, Communication Relating to the Results of the Partial International Search, PCT/US02/02849, Aug. 26, 2002.

International Search Report, PCT/US02/02849, Dec. 2, 2002.

Mensz et al., $In_xGA_{1-x}N/Al_yGA_{1-y}N$ *Violet Light Emitting Diodes with Reflective p–Contacts for High Single Sided Light Extraction,* Electronics Letters, vol. 33, No. 24, Nov. 20, 1997, pp. 2066–2068.

Honma et al., *Evaluation of Barrier Metals of Solder Bumps for Flip–Chip Interconnection*, Electronic Manufacturing Technology Symposium, 1995, Proceedings of 1995 Japan International, 18th IEEE/CPMT, Dec. 4, 1995, pp. 113–116.

Lee et al., *Bonding of InP Laser Diodes by Au–Sn Solder and Tungsten–Based Barrier Metallization Schemes*, Semiconductor Science and Technology, vol. 9, No. 4, Apr. 1994, pp. 379–386.

* cited by examiner

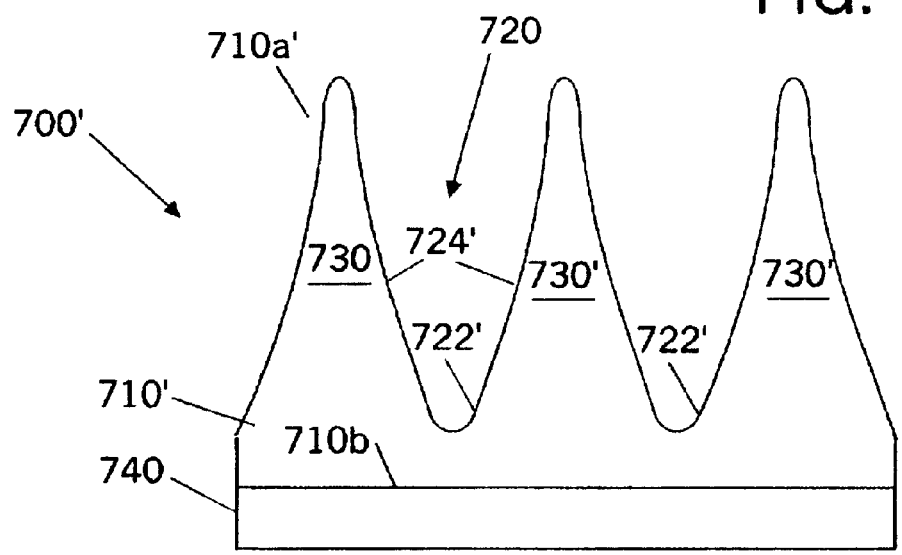
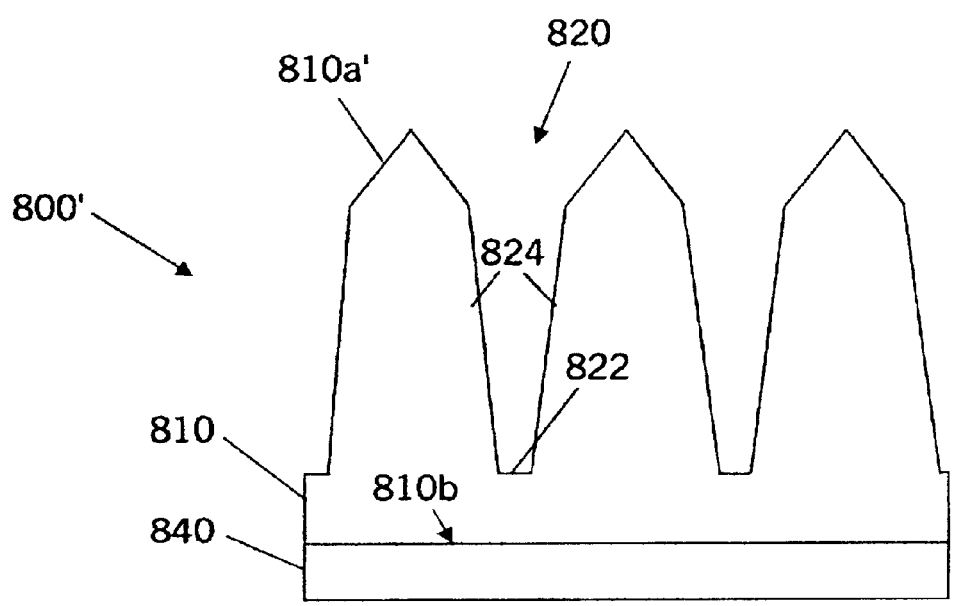

LIGHT EMITTING DIODES INCLUDING MODIFICATIONS FOR LIGHT EXTRACTION

CROSS-REFERENCE TO PROVISIONAL APPLICATIONS

This application claims the benefit of Provisional Application Serial No. 60/265,707, filed Feb. 1, 2001 entitled *Light Emitting Diode With Optically Transparent Silicon Carbide Substrate*, and Provisional Application Serial No. 60/307,235, filed Jul. 23, 2001, entitled *Light Emitting Diodes Including Modifications for Light Extraction and Manufacturing Methods Therefor*, the disclosures of both of which are hereby incorporated herein by reference in their entirety as if set forth fully herein.

STATEMENT OF FEDERAL SUPPORT

This invention was made possible with government support under grant number 70NANB8H4022 from the National Institute of Standards and Technology (Advanced Technology Program). The United States government has certain rights to this invention.

FIELD OF THE INVENTION

This invention relates to microelectronic devices and fabrication methods therefor, and more particularly to light emitting diodes (LEDs) and manufacturing methods therefor.

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

One measure of efficiency of LEDs is the cost per lumen. The cost per lumen for an LED may be a function of the manufacturing cost per LED chip, the internal quantum efficiency of the LED material and the ability to couple or extract the generated light out of the device. An overview of light extraction issues may be found in the textbook entitled *High Brightness Light Emitting Diodes* to Stringfellow et al., Academic Press, 1997, and particularly Chapter 2, entitled *Overview of Device Issues in High-Brightness Light Emitting Diodes*, to Craford, at pp. 47–63.

Light extraction has been accomplished in many ways, depending, for example, on the materials that are used to fabricate the diode region and the substrate. For example, in gallium arsenide and gallium phosphide material systems, a thick, p-type, topside window layer may be used for light extraction. The p-type window layer may be grown because high epitaxial growth rates may be possible in the gallium arsenide/gallium phosphide material systems using liquid and/or vapor phase epitaxy. Moreover, current spreading may be achieved due to the conductivity of the p-type topside window layer. Chemical etching with high etch rates and high etch selectivity also may be used to allow the removal of at least some of the substrate if it is optically absorbent. Distributed Bragg reflectors also have been grown between an absorbing substrate and the diode region to decouple the emitting and absorbing regions.

Other approaches for light extraction may involve mechanical shaping or texturing of the diode region and/or the substrate. However, it may be desirable to provide other light extraction techniques that can allow further improvements in extraction efficiency. Moreover, it may be desirable to increase the area of an LED chip from about 0.1 mm² to larger areas, to thereby provide larger LEDs. Unfortunately, the effectiveness of these shaping techniques may not be maintained as the chip dimensions are scaled up for higher power/intensity and/or other applications.

Much development interest and commercial activity recently has focused on LEDs that are fabricated in or on silicon carbide, because these LEDs can emit radiation in the blue/green portions of the visible spectrum. See, for example, U.S. Pat. No. 5,416,342 to Edmond et al., entitled *Blue Light-Emitting Diode With High External Quantum Efficiency*, assigned to the assignee of the present application, the disclosure of which is hereby incorporated herein by reference in its entirety as if set forth fully herein. There also has been much interest in LEDs that include gallium nitride-based diode regions on silicon carbide substrates, because these devices also may emit light with high efficiency. See, for example, U.S. Pat. No. 6,177,688 to Linthicum et al., entitled *Pendeoepitaxial Gallium Nitride Semiconductor Layers On Silicon Carbide Substrates*, the disclosure of which is hereby incorporated herein by reference in its entirety as if set forth fully herein.

In such silicon carbide LEDs or gallium nitride LEDs on silicon carbide, it may be difficult to use conventional techniques for light extraction. For example, it may be difficult to use thick p-type window layers because of the relatively low growth rate of gallium nitride. Also, although such LEDs may benefit from the use of Bragg reflectors and/or substrate removal techniques, it may be difficult to fabricate a reflector between the substrate and the gallium nitride diode region and/or to etch away at least part of the silicon carbide substrate.

U.S. Pat. No. 4,966,862 to Edmond, entitled *Method of Production of Light Emitting Diodes*, assigned to the assignee of the present application, the disclosure of which is hereby incorporated herein by reference in its entirety as if set forth fully herein, describes a method for preparing a plurality of light emitting diodes on a single substrate of a semiconductor material. The method is used for structures where the substrate includes an epitaxial layer of the same semiconductor material that in turn comprises layers of p-type and n-type material that define a p-n junction therebetween. The epitaxial layer and the substrate are etched in a predetermined pattern to define individual diode precursors, and deeply enough to form mesas in the epitaxial layer that delineate the p-n junctions in each diode precursor from one another. The substrate is then grooved from the side of the epitaxial layer and between the mesas to a predetermined depth to define side portions of diode precursors in the substrate while retaining enough of the substrate beneath the grooves to maintain its mechanical stability. Ohmic contacts are added to the epitaxial layer and to the substrate and a layer of insulating material is formed on the diode precursor. The insulating layer covers the portions of the epitaxial layer that are not covered by the ohmic contact, any portions of the one surface of the substrate adjacent the mesas, and the side portions of the substrate. As a result, the junction and the side portions of the substrate of each diode are insulated from electrical contact other than through the ohmic contacts. When the diodes are separated they can be conventionally mounted with the junction side down in a conductive epoxy without concern that the epoxy will short circuit the resulting diode. See the abstract of U.S. Pat. No. 4,966,862.

U.S. Pat. No. 5,210,051 to Carter, Jr., entitled *High Efficiency Light Emitting Diodes From Bipolar Gallium Nitride*, assigned to the assignee of the present application, the disclosure of which is hereby incorporated herein by reference in its entirety as if set forth fully herein, describes a method of growing intrinsic, substantially undoped single crystal gallium nitride with a donor concentration of $7\times10^{17}$ cm$^3$ or less. The method comprises introducing a source of nitrogen into a reaction chamber containing a growth surface while introducing a source of gallium into the same reaction chamber and while directing nitrogen atoms and gallium atoms to a growth surface upon which gallium nitride will grow. The method further comprises concurrently maintaining the growth surface at a temperature high enough to provide sufficient surface mobility to the gallium and nitrogen atoms that strike the growth surface to reach and move into proper lattice sites, thereby establishing good crystallinity, to establish an effective sticking coefficient, and to thereby grow an epitaxial layer of gallium nitride on the growth surface, but low enough for the partial pressure of nitrogen species in the reaction chamber to approach the equilibrium vapor pressure of those nitrogen species over gallium nitride under the other ambient conditions of the chamber to thereby minimize the loss of nitrogen from the gallium nitride and the nitrogen vacancies in the resulting epitaxial layer. See the abstract of U.S. Pat. No. 5,210,051.

In view of the above discussion, improved light extraction techniques may be desirable for LEDs, especially LEDs that are fabricated from silicon carbide, that are fabricated from gallium nitride on silicon carbide and/or that have a relatively large area.

SUMMARY OF THE INVENTION

Light emitting diodes according to some embodiments of the invention include a substrate having first and second opposing faces that is transparent to optical radiation in a predetermined wavelength range and that is patterned to define, in cross-section, a plurality of pedestals that extend into the substrate from the first face towards the second face. As used herein, the term "transparent" refers to an element, such as a substrate, layer or region that allows some or all optical radiation in a predetermined wavelength range to pass therethrough, i.e., not opaque. A diode region on the second face is configured to emit light in the predetermined wavelength range, into the substrate upon application of voltage across the diode region. In other embodiments, a mounting support on the diode region, opposite the substrate is configured to support the diode region, such that the light that is emitted from the diode region into the substrate, is emitted from the first face upon application of voltage across the diode region. In some embodiments, the light emitting diode on a transparent substrate with pedestals is flip-mounted on a mounting support, with the diode region adjacent to the mounting support and a substrate opposite the mounting support, for light emission through the substrate. In other embodiments, the light emitting diode on a transparent substrate with pedestals is mounted on a mounting support, with the substrate adjacent to the mounting support and the diode region opposite the mounting support. Thus, non-flip-chip mounting also may be provided.

In yet other embodiments of the invention, a reflector also is provided between the mounting support and the diode region or the substrate. The reflector may be configured to reflect light that is emitted from the diode region back through the diode region, through the substrate and from the pedestals, upon application of voltage across the diode region. In other embodiments, a transparent electrode also may be provided between the diode region and the reflector. In still other embodiments, a solder preform and/or other bonding region may be provided between the reflector and the mounting support and/or an optical element such as a window or lens may be provided adjacent the first face opposite the diode region. In yet other embodiments, the diode region includes a peripheral portion and at least one central portion that is enclosed by the peripheral portion, and the light emitting diode further comprises at least one electrode on the diode region, that is confined to within the at least one central portion and does not extend onto the peripheral portion. It will be understood that the central portion need not be centered on the diode region.

In other embodiments of the invention, a contact structure for the substrate and/or the diode region of an LED includes a transparent ohmic region, a reflector, a barrier region and a bonding region. The transparent ohmic region provides electrical contact and/or current spreading. The reflector reflects at least some incident radiation and also may provide current spreading. The barrier region protects the reflector and/or the ohmic region. The bonding region bonds the LED package to a mounting support. In some embodiments, the functionality of the transparent ohmic region and the reflector can be combined in a single ohmic and reflector region. Contact structures according to these embodiments of the invention also may be used with conventional silicon carbide LEDs, gallium nitride on silicon carbide LEDs and/or other LEDs.

In still other embodiments of the present invention, the first face of the substrate may include therein at least one groove that defines a plurality of pedestals, such as triangular pedestals, in the substrate. The grooves may include tapered sidewalls and/or a beveled floor. The first and second faces of the substrate may have square perimeters, and/or the first face of the substrate may be textured. The light emitting diode may further include a plurality of emission regions and/or electrodes on the diode region, a respective one of which is confined to within a respective one of the pedestals and does not extend beyond the respective one of the pedestals.

In yet other embodiments of the present invention, the first face of the substrate includes therein an array of via holes. The via holes may include tapered sidewalls and/or a floor. The via holes preferably extend only part way through the substrate, but in other embodiments they can extend all the way through the substrate. The first and second substrate faces may have square perimeters, and/or the first face may be textured. The light emitting diodes may further include at least one electrode on the diode region that does not overlap the array of via holes.

The pedestals and/or array of via holes also may be used with light emitting diodes that include silicon carbide or non-silicon carbide substrates, to allow improved light extraction therefrom. Moreover, electrodes as described above also may be used with light emitting diodes that include a non-silicon carbide substrate. For example, when the first face of the substrate has smaller surface area than the second face, and the diode region is on the second face, an emission region may be provided on the diode region that is confined to within the smaller surface area of the first face.

In other embodiments of the present invention, light emitting diodes include a compensated, colorless silicon carbide substrate having first and second opposing faces and a gallium nitride-based diode region on the second face that is configured to emit light into the substrate upon application of voltage across the diode region. Mounting supports, reflectors, contact structures, grooves, pedestals, texturing and/or confined emission areas/electrodes may be provided according to any of the embodiments that were described above.

Accordingly, many of the above-described embodiments comprise embodiments of means for extracting from the substrate at least some of the light that is emitted into the substrate by the diode region. Examples of these means for extracting include compensating dopants in the silicon carbide substrate to provide a colorless silicon carbide substrate, patterning the substrate to define, in cross-section, a plurality of pedestals that extend into the substrate from the first face toward the second face and/or many of the other embodiments that were described above, including mounting supports, reflectors, contact structures, grooves, pedestals, texturing and/or confined emission areas/electrodes.

Light emitting diodes may be manufactured, according to some embodiments of the invention, by forming a diode region that is configured to emit light in a predetermined wavelength range on a second face of a substrate having first and second opposing faces, and that is transparent to the optical radiation in the predetermined wavelength range. The substrate is patterned before, during and/or after forming the diode region to define, in cross-section, a plurality of pedestals that extend into the substrate from the first face towards the second face. In other embodiments, the diode region is mounted onto a mounting substrate that is configured to support the diode region such that the light that is emitted from the diode region into the substrate is emitted from the first face upon application of voltage across the diode region. The mounting may be preceded by forming a reflector on the diode region such that the reflector is configured to reflect light that is emitted from the diode region back into the diode region through the substrate and from the first face, upon application of voltage across the diode region. Prior to forming the reflector, a transparent ohmic electrode also may be formed on the diode region opposite the substrate. A barrier region and/or an adhesion region also may be formed after forming the reflector. In other embodiments, a mounting support is placed adjacent the reflector with the barrier region and/or the adhesion region therebetween, and the LED is joined to the mounting support. In still other embodiments, an electrode is formed on the diode region that is confined to within the central portion thereof and does not extend onto the peripheral portion thereof.

Other method embodiments include forming a plurality of intersecting grooves into the first face of the substrate to define the plurality of pedestals, such as triangular pedestals, in the substrate. The grooves may include tapered sidewalls and/or a beveled floor. The first face of the substrate also may be textured. A plurality of electrodes also may be formed on the diode region. In some embodiments, a respective one of the electrodes is confined to within a respective one of the pedestals and does not extend beyond the respective one of the pedestals.

Still other method embodiments according to the present invention include reactive ion etching an array of via holes in the first face of the substrate. The via holes may include tapered sidewalls and/or a floor. The first face also may be textured. An electrode may be formed on the diode region that does not overlap the array of via holes.

Sawing a plurality of intersecting grooves and/or reactive etching an array of via holes into the first face may be used for light emitting diodes that include a silicon carbide or non-silicon carbide substrate to allow improved light extraction therefrom. Moreover, the formation of an emission region on the diode region that is confined to within the smaller surface area of the first face also may be used for other conventional light emitting diodes, to allow improved light extraction therefrom.

BRIEF DESCRIPTION OF THE DRAWINGS

FIG. 7A is a top view and FIGS. 7B and 7C are cross-sectional views along the line 7B–7B' of FIG. 7A, of light emitting diodes according to other embodiments of the present invention.

FIG. 8A is a top view and FIGS. 8B and 8C are cross-sectional views along the line 8B–8B' of FIG. 8A, of light emitting diodes according to other embodiments of the present invention.

DETAILED DESCRIPTION OF PREFERRED EMBODIMENTS

Figure 1:
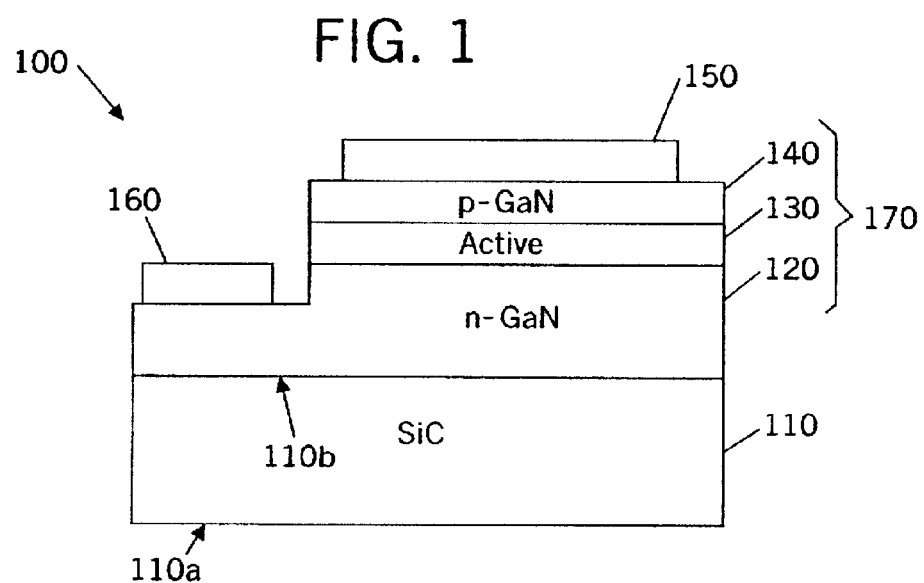
FIGS. 1–5 are cross-sectional views of light emitting diodes according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Embodiments of the invention now will be described, generally with reference to gallium nitride-based light emitting diodes on silicon carbide-based substrates. However, it will be understood by those having skill in the art that many embodiments of the invention may be employed with any combination of a substrate that is non-absorbing or transparent to the emitted light and an index matched light emitting diode epitaxial layer. In some embodiments, the refractive index of the substrate is greater than that of the diode. Accordingly, combinations can include an AlGaInP diode on a GaP substrate; an InGaAs diode on a GaAs substrate; an AlGaAs diode on a GaAs substrate; an SiC diode on an SiC Substrate, an SiC diode on a sapphire ($Al_2O_3$) substrate; and/or a nitride-based diode on a gallium nitride, silicon carbide, aluminum nitride, zinc oxide and/or other substrate.

FIG. 1 is a cross-sectional view of light emitting diodes according to some embodiments of the present invention. As shown in FIG. 1, these light emitting diodes 100 include a silicon carbide substrate 110 having first and second opposing faces 110a and 110b and that is transparent to optical radiation in a predetermined wavelength range. A diode region 170 is on the second face 110b and is configured to emit light in the predetermined wavelength range into the silicon carbide substrate 110 that is transparent to optical radiation in the predetermined wavelength range, upon application of voltage across the diode region, for example across ohmic contacts 150 and 160.

Still referring to FIG. 1, the diode region 170 includes an n-type layer 120, an active region 130, and a p-type layer 140. Ohmic contacts 150 and 160 are made to the p-type layer 140 and the n-type layer 120, respectively, to form an anode and a cathode, respectively. The diode region 170 including the n-type layer 120, the active region 130, and/or the p-type layer 140 preferably comprise gallium nitride-based semiconductor layers, including alloys thereof such as indium gallium nitride and/or aluminum indium gallium nitride. The fabrication of gallium nitride on silicon carbide is known to those having skill in the art, and is described for example in the above-incorporated U.S. Pat. No. 6,177,688. It also will be understood that a buffer layer or layers, for example comprising aluminum nitride, may be provided between the n-type gallium nitride layer 120 and the silicon carbide substrate 110, for example as described in U.S. Pat. Nos. 5,393,993, 5,523,589, 6,177,688, and application Ser. No. 09/154,363 entitled *Vertical Geometry InGaN Light Emitting Diode*, the disclosures of which are hereby incorporated herein by reference in their entirety as if set forth fully herein.

The active region 130 may comprise a single layer of n-type, p-type or intrinsic gallium nitride-based materials, another homostructure, a single heterostructure, a double heterostructure and/or a quantum well structure, all of which are well known to those having skill in the art. Moreover, the active region 130 may comprise a light emitting layer bounded by one or more cladding layers. Preferably, the n-type gallium nitride layer 120 comprises silicon-doped gallium nitride, while the p-type gallium nitride layer 130 comprises magnesium-doped gallium nitride. In addition, the active region 130 preferably includes at least one indium gallium nitride quantum well.

In some embodiments, the ohmic contact 150 for the p-type gallium nitride layer 140 comprises platinum, nickel and/or titanium/gold. In other embodiments, a reflective ohmic contact comprising, for example, aluminum and/or silver, may be used. The ohmic contact 160 to the n-type gallium nitride 120 preferably comprises aluminum and/or titanium. Other suitable materials that form ohmic contacts to p-type gallium nitride and n-type gallium nitride may be used for ohmic contacts 150 and 160, respectively. Examples of ohmic contacts to n-type gallium nitride and p-type gallium nitride are shown, for example in U.S. Pat. No. 5,767,581, the disclosure of which is hereby incorporated herein by reference in its entirety as if set forth fully herein.

Still referring to FIG. 1, in some embodiments, the substrate 110 comprises a silicon carbide substrate that is transparent to optical radiation in the predetermined wavelength range. One technique for fabricating a silicon carbide substrate that is transparent to optical radiation in a predetermined wavelength range is described in U.S. Pat. No. 5,718,760, which is assigned to the assignee of the present invention, the disclosure of which is hereby incorporated herein in its entirety as if set forth fully herein. Silicon carbide substrate 110 may comprise the 2H, 4H, 6H, 8H, 15R and/or 3C polytypes. The 6H and/or 4H polytype may be preferred for optoelectronic applications.

In other embodiments, the silicon carbide substrate 110 is a compensated, colorless silicon carbide substrate, as described in the above-cited U.S. Pat. No. 5,718,760. As described therein, colorless silicon carbide may be fabricated by sublimation of silicon carbide in the presence of compensating amounts of p-type and n-type dopants. Naturally-occurring silicon carbide typically is black, due to high impurity levels. Conventional microelectronic silicon carbide wafers have a translucent blue, amber or green hue depending upon the controlled doping level in the crystal. As described in U.S. Pat. No. 5,718,760, it was found that by carefully controlling the doping of silicon carbide crystals with compensating levels of n-type and p-type dopants at low doping concentrations, colorless single crystals of silicon carbide may be obtained. In particular, it may be desirable to reduce and preferably minimize the unintentional nitrogen (n-type) doping in the material and to introduce low levels of compensating p-type dopants, to thereby create colorless silicon carbide.

Figure 6:
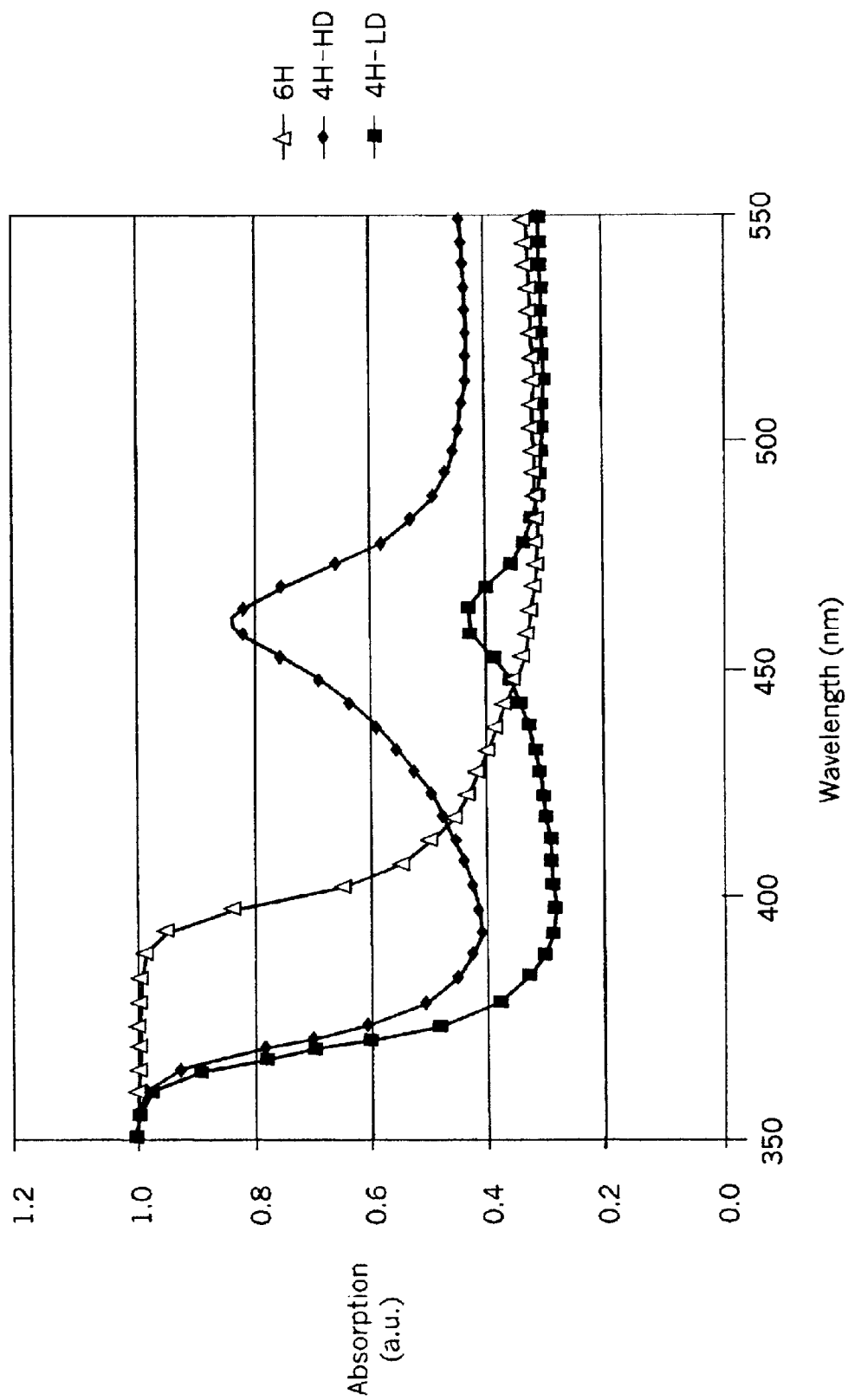
FIG. 6 graphically illustrates absorption of light versus wavelength for silicon carbide at various doping levels.

As seen in FIG. 6, 4H—SiC is characterized by an absorption peak at around 460 nm. FIG. 6 shows that by reducing doping levels in 4H—SiC, that absorption peak can be substantially reduced, so that the 4H—SiC becomes transparent at around 460 nm. The curve labeled 4H-HD shows measured absorption values for 4H silicon carbide doped with a net donor concentration of approximately $2.5 \times 10^{18}$, while the curve labeled 4H-LD shows measured absorption values for 4H silicon carbide doped with a net donor concentration of approximately $5 \times 10^{17}$. Further reduction in doping levels may result in even lower absorption levels. The curve labeled 6H also shows a transparent substrate at around 460 nm.

In accordance with some embodiments of the present invention, colorless boules of silicon carbide grown, for example, according to processes described in U.S. Pat. No. 5,718,760 and references cited therein, may be cut into wafers for processing. Gallium nitride-based epitaxial layers may be formed on the wafers, for example, as described in U.S. Pat. No. 6,177,688, which then can be processed to produce structures such as are shown in FIG. 1.

In LEDs having silicon carbide substrates, it previously may have been preferable to prevent light generated in the active region from entering the substrate, for a number of reasons. For example, although silicon carbide may be highly transparent compared to gallium arsenide, conventional silicon carbide substrates can absorb some light in portions of the visible spectrum. Moreover, since conventional silicon carbide devices are vertical devices that are mounted with the substrates facing down, some light entering the substrate can be reflected back through the substrate before it is extracted from the device, thereby increasing absorption losses in the substrate. Reflection losses also may reduce the overall efficiency of the device.

Gallium nitride and silicon carbide have similar indices of refraction. In particular, gallium nitride has an index of refraction of about 2.5, while silicon carbide has an index of refraction of about 2.6–2.7. In that sense, gallium nitride and silicon carbide may be said to be optically matched. Thus, very little internal reflection may occur at a boundary between gallium nitride and silicon carbide. Consequently, it may be difficult to prevent light generated in a gallium nitride-based layer from passing into a silicon carbide substrate.

By providing a compensated, colorless silicon carbide substrate that is grown, for example, in accordance with methods described in U.S. Pat. No. 5,718,760, absorption of visible light in the silicon carbide substrate may be reduced. As is well known to one skilled in the art, absorption losses may increase as doping increases due to the so-called "Biedermann Effect". Consequently, extraction of visible light from the substrate may be enhanced when doping is reduced and preferably minimized, thereby improving the overall efficiency of the device. In contrast to silicon carbide, sapphire has an index of refraction of about 1.8. Thus, in a sapphire-based gallium nitride LED, a large portion of light generated in the gallium nitride active layer may not pass into the substrate but will be reflected away from the substrate.

In other embodiments of the present invention, the doping of the silicon carbide substrate may be controlled such that light in the wavelength range generated in the diode region 170 of the device is not absorbed by the substrate 110, although other wavelengths may be absorbed. Thus, the absorption characteristics of the silicon carbide substrate may be adjusted to pass desired wavelengths of light. For example, the active region 130 may be designed to emit blue light in the vicinity of 450 nm. The doping of the silicon carbide substrate 110 may be controlled such that light rays having a wavelength of approximately 450 nm are not substantially absorbed by the substrate 110. Thus, although the substrate may not be entirely colorless, and other wavelengths may be absorbed, it nevertheless may be transparent to the wavelengths of interest, namely those generated in the LED region 170. In preferred embodiments, the bandgap and/or doping of the silicon carbide substrate 110 is controlled such that the substrate is transparent to light within the range of about 390–550 nm.

Thus, in some embodiments, the substrate 110 may be thought of as a filter which may improve the spectral purity of light output by the device. For example, it is known to those skilled in the art that gallium nitride-based blue LEDs may produce unwanted emission in the ultraviolet (UV) spectrum in addition to the desired emission. Such UV emissions may be undesirable at even moderately low power levels since they may degrade the plastic materials in which LEDs are packaged, which may result in reliability problems and/or reduced lifetimes. It is also known that 6H silicon carbide absorbs UV light. Thus, it may be preferable to extract light through a 6H silicon carbide substrate, which filters out unwanted UV emissions.

Instead of discouraging or inhibiting light from entering the substrate, as may be done conventionally, embodiments of the present invention can encourage light generated in the diode region 170 to enter the substrate 110, where it can be most efficiently extracted. Thus, some embodiments of the invention can provide means for extracting from the substrate, at least some of the light that is emitted into the substrate by the diode region. Accordingly, some embodiments of the present invention may be particularly suited for use in a so-called "flip-chip" or "upside-down" packaging configuration as will now be described in connection with FIG. 2. Embodiments of the invention also may be used with conventional "right-side-up" or "non-flip-chip" packaging, as will be described in connection with FIG. 16.

Figure 2:
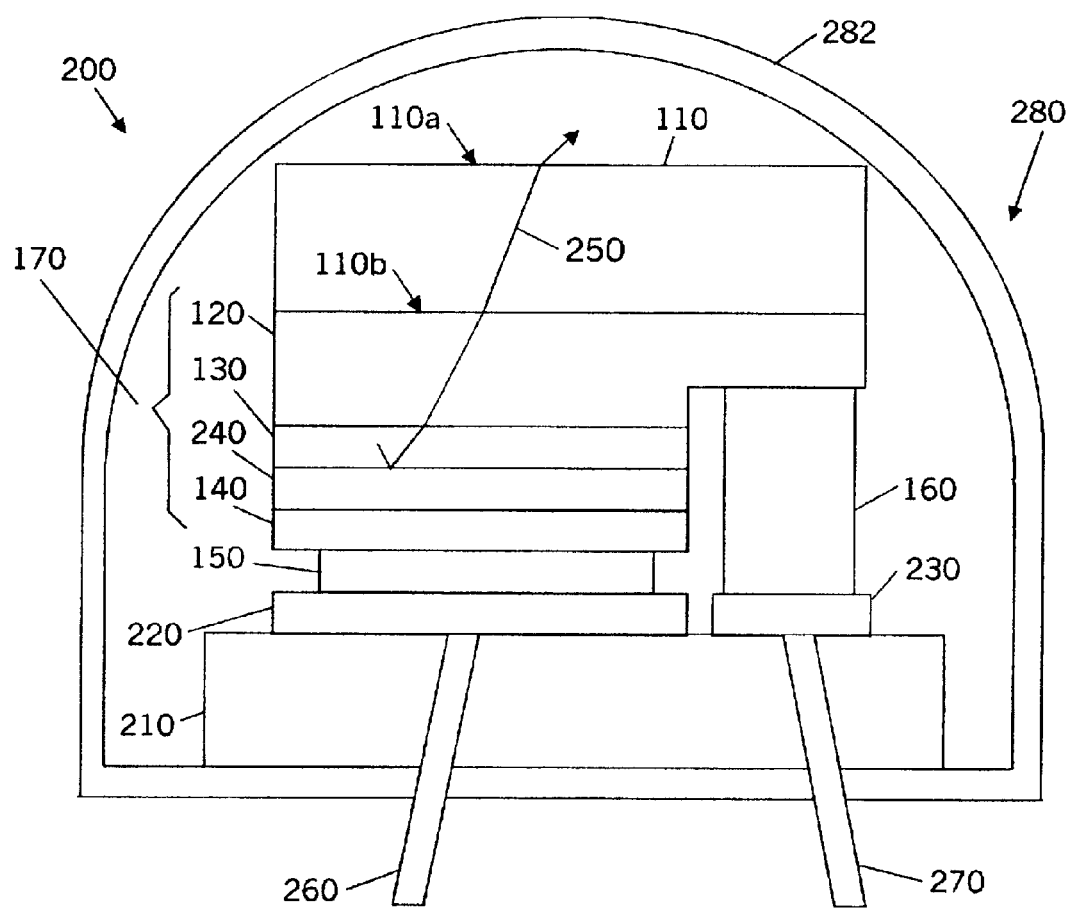

Referring now to FIG. 2, other embodiments of light emitting diodes according to embodiments of the present invention are shown. In FIG. 2, a light emitting diode 200 is shown flip-chip, or upside-down mounted on a mounting support 210, such as a heat sink, using bonding regions 220 and 230. The bonding regions 220 and 230 may include solder preforms that are attached to the diode region and/or the mounting support 210, and that can be reflowed to attach the ohmic contacts 150 and 160 to the mounting support 210 using conventional solder reflowing techniques. Other bonding regions 220 and 230 may comprise gold, indium and/or braze. As also shown in FIG. 2, the flip-chip or upside-down packing configuration places the silicon carbide substrate 110 up, away from the mounting substrate 210, and places the diode region 170 down, adjacent to the mounting substrate 210. A barrier region (not shown) also may be included between a respective ohmic contact 150, 160 and a respective melting region 220, 230. The barrier region may comprise nickel, nickel/vanadium and/or titanium/tungsten. Other barrier regions also may be used.

Still referring to FIG. 2, as shown by light ray 250, light generated in the active region 130 enters the substrate 110, and exits the device from the first face 110a of the substrate 110. In order to encourage light generated in the active region 130 to enter the substrate 110, a reflector 240 may be provided that is positioned between the active region 130 and the mounting support 210, opposite the substrate 110. The reflector 240 may be positioned between the active region 130 and the p-type layer 140 as shown in FIG. 2. However, there may be one or more intervening layers between the reflector 240 and the active region 130 and/or the p-type layer 140. Moreover, the p-type layer 140 may be positioned between the reflector 240 and the active region 130. Other configurations also may be provided, for example, as will be described in connection with FIG. 16 below.

The reflector 240 may comprise an aluminum gallium nitride (AlGaN) layer and/or a distributed Bragg reflector that can reflect light from the active region 130 back towards the substrate 110. The design and fabrication of Bragg reflectors is well known to those having skill in the art and is described, for example, in U.S. Pat. No. 6,045,465, the disclosure of which is hereby incorporated herein by reference in its entirety as if set forth fully herein. It also will be understood that the reflector also can modify the pattern of photon emission from the active region 130 itself, thereby directing more photons to escape the device. Other conventional reflector structures also may be used.

Still referring to FIG. 2, the exemplary ray 250 is shown to illustrate how the light that is generated within the active region 130 may initially travel in a direction away from the substrate 110, but will be reflected by the reflector 240 back through the substrate 110 and out of the device 200. It will be noted that in the flip-chip configuration that is illustrated in FIG. 2, the ray 250 only needs to travel through the substrate 110 one time before exiting the device.

LEDs 200 according to embodiments of the invention may be packaged in conventional dome structures 280 that include an optical element such as a lens 282 for light emission. The entire dome 280 may function as an optical element. An anode lead 260 and a cathode lead 270 also may be provided for external connections. The dome structure 280 may comprise plastic, glass and/or other materials and also may include silicone gel and/or other materials therein.

Figure 3:
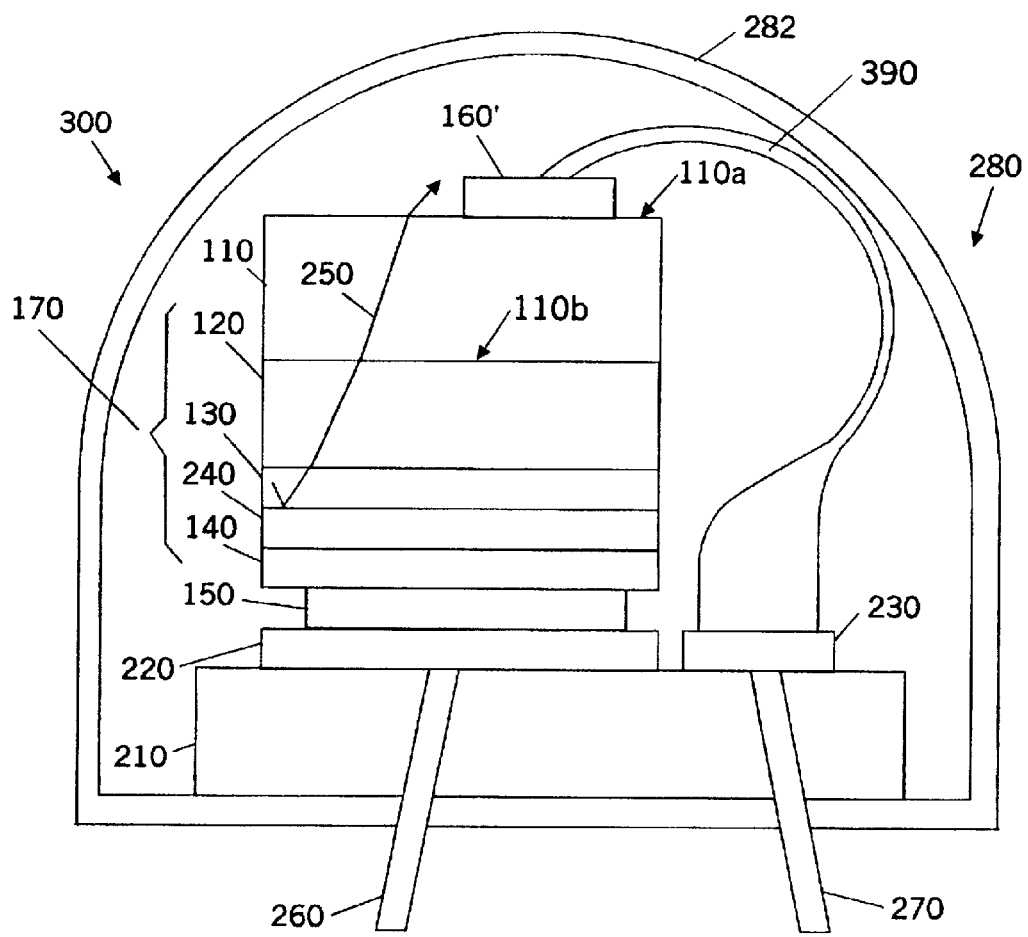

Referring now to FIG. 3, vertical light emitting diodes 300 also may be packaged in a flip-chip configuration by providing a cathode ohmic contact 160' on the first face 110a of the silicon carbide substrate 110, and providing a wire 390 or other electrical connection between the cathode ohmic contact 160' on the first face 110a to the external cathode lead 270. Non-flip-chip configurations also may be provided, for example, as will be described in connection with FIG. 16 below.

Figure 4:
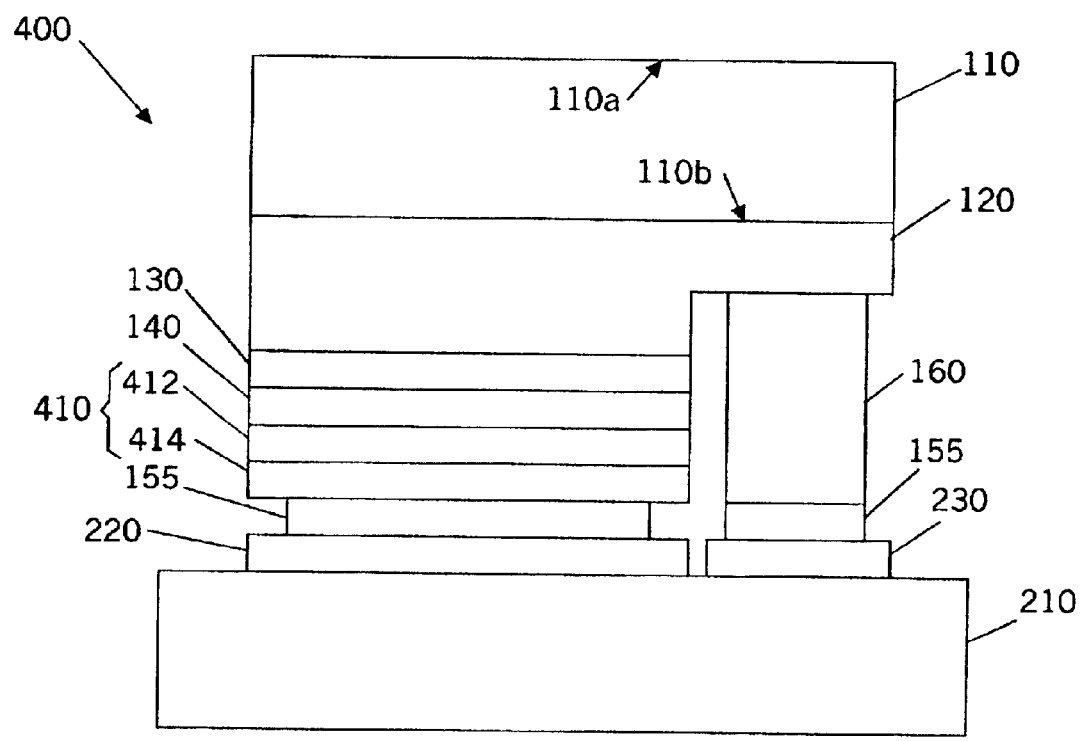

FIG. 4 illustrates other LEDs according to embodiments of the invention. In these LEDs 400, an anode contact may include an ohmic and reflective region 410, which may include a plurality of layers, including a thin transparent ohmic contact 412 and a reflector 414. The thin transparent ohmic contact 412 may comprise platinum, and preferably should be as thin as possible to avoid substantial absorption of light. The thickness of the thin transparent ohmic contact 412 preferably is between about 10 Å and about 100 Å for a platinum transparent electrode 412. In other embodiments, the thin transparent ohmic contact 412 may comprise nickel/gold, nickel oxide/gold, nickel oxide/platinum, titanium and/or titanium/gold, having thickness between about 10 Å and about 100 Å. The reflector 414 preferably is thicker than about 300 Å and preferably comprises aluminum and/or silver. Embodiments of FIG. 4 can provide improved current spreading, since the reflector 414 contacts the thin transparent ohmic contact 412 over the entire surface area of the thin transparent ohmic contact 412. Thus, current need not travel horizontally through the anode contact 410, as may be the case in conventional devices. Current spreading thus may be enhanced. Devices 400 of FIG. 4 also may be packaged as was shown in FIGS. 2 and 3. Other contact structures may be used, for example, as will be described in detail below in connection with FIGS. 16 and 17. For example, a barrier region 155 comprising, for example, nickel, nickel/vanadium and/or titanium/tungsten may be provided between the reflector 414 and the bonding region 220 and between the ohmic contact 160 and the bonding region 230.

Figure 5:
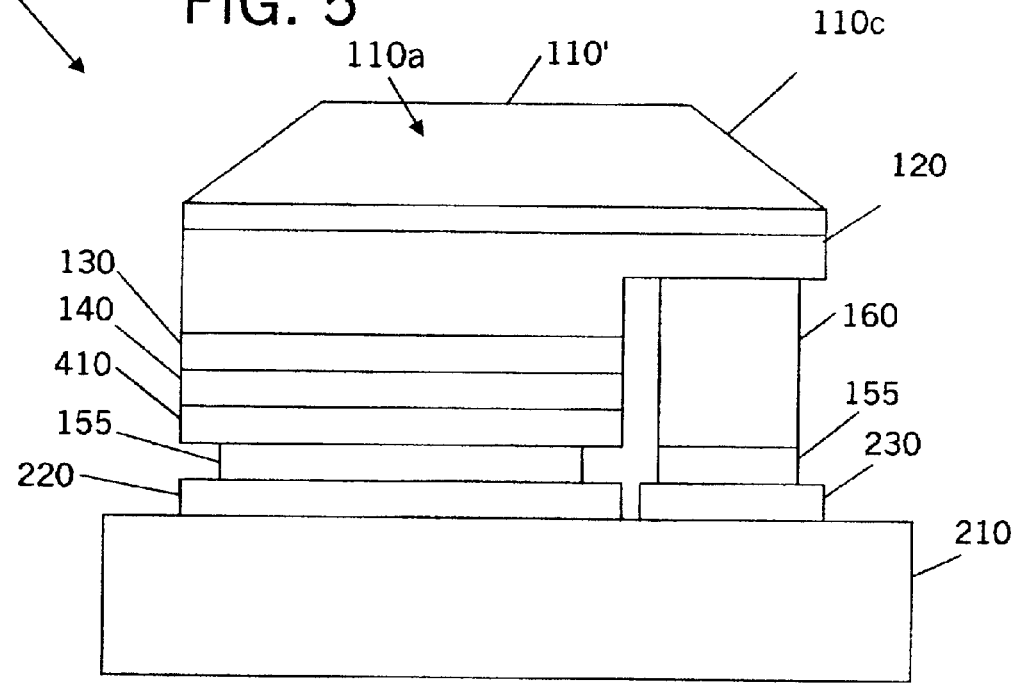

LEDs according to other embodiments of the present invention are illustrated in FIG. 5. These embodiments of LEDs 500 can enhance light extraction from the LED by beveling or slanting at least some of the sidewall 110c of the substrate 110'. Since the incident angle of light striking the beveled sidewall 110c is generally closer to the normal than it otherwise might be, less light may be reflected back into the substrate 110'. Accordingly, light may be extracted from the substrate 110' which can improve the overall efficiency of the device. Extraction efficiency may be further improved by roughening or texturing the sidewalls 110c and/or the first face 110a, of the substrate 110', for example using conventional methods.

Accordingly, light emitting diodes according to some embodiments of the invention include a substrate and a gallium nitride-based diode region. The substrate comprises single crystal, transparent silicon carbide for an emission range of interest, preferably fabricated via sublimation. The substrate may be between about 100 µm and about 1000 µm thick. External efficiency of the diode can be enhanced due to increased light extraction from the substrate. In some embodiments of the invention, the diode includes a reflector that reflects light generated in the diode region back into the substrate for subsequent extraction from the device. The reflector may comprise a layer of material with a relatively low index of refraction (such as AlGaN) on the active region opposite the substrate. Alternatively, the reflector may comprise a Bragg reflector within the structure and/or a coating layer of aluminum and/or silver on a transparent ohmic contact. Other embodiments will be described below. In yet other embodiments, a portion of the sidewalls of the substrate may be tapered and/or roughened to allow improved light extraction. Diodes according to embodiments of the present invention may be particularly suited for use in a flip-chip mounting structure. However, non-flip-chip mounting also may be used.

Embodiments of the invention that were described in FIGS. 1–6 above provide modifications of the silicon carbide substrate, to embody means for extracting at least some of the light in a predetermined wavelength range, and thereby allow flip-chip or non-flip-chip mounting of gallium nitride on silicon carbide LEDs. Other embodiments of the invention now will be described where various geometric modifications are made to the substrate, to provide other embodiments of means for extracting at least some of the light from the substrate, to allow increased extraction efficiency. These substrate modifications may be especially useful when large area chips are being fabricated, to provide other embodiments of means for extracting, from the substrate, at least some of the light, and allow enhanced extraction efficiency from interior regions of the substrate. These enhancements may be used with silicon carbide substrates, as was described in connection with FIGS. 1–6 above, but also may be used with conventional substrates comprising gallium arsenide, gallium phosphide, alloys thereof and/or sapphire.

Figure 7A:
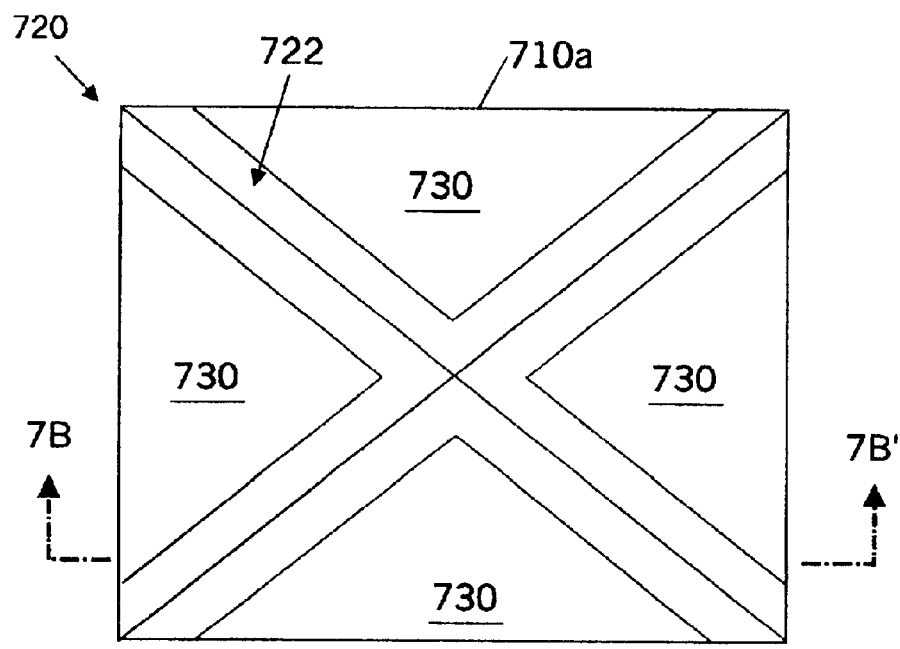
Figure 7B:
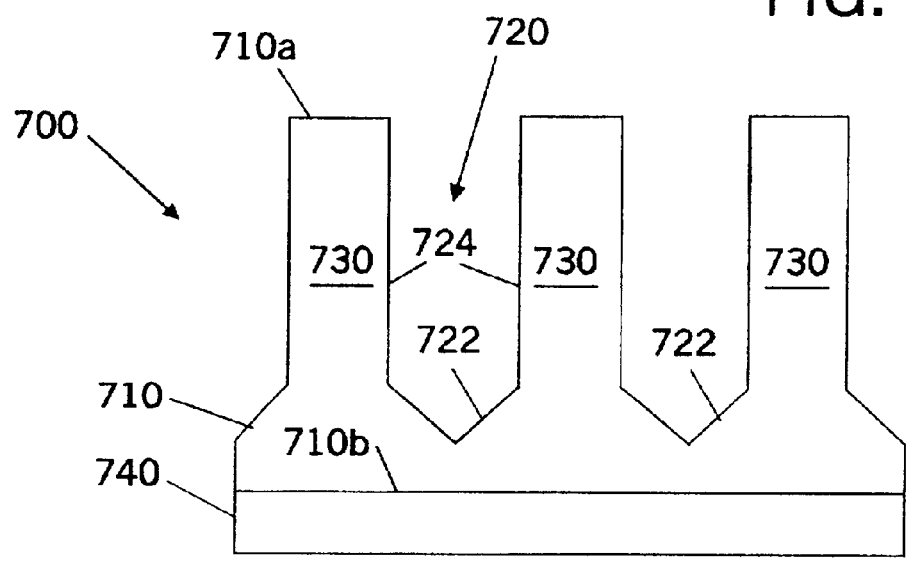

FIG. 7A is a top view of LEDs according to other embodiments of the present invention. FIGS. 7B and 7C are cross-sectional views of LEDs of FIG. 7A taken along line 7B–7B' of 7A, according to other embodiments of the present invention.

Referring now to FIGS. 7A–7C, these LEDs include a substrate 710 having first and second opposing faces 710a and 710b, respectively, and a diode region 740 on the second face 710b of the substrate 710. The substrate 710 may be a silicon carbide substrate 110, such as was described in FIGS. 1–6, and/or another conventional LED substrate. The diode region 740 may include a diode region 170 of FIGS. 1–5 above, and/or any other conventional diode region.

As also shown in FIG. 7A, the first face 710a of these LEDs 700 include therein a plurality of grooves 720 that define a plurality of pedestals 730 in the substrate. In FIG. 7A, triangular pedestals are shown. However, pedestals of other polygonal or non-polygonal shapes may be provided. As shown in FIG. 7B, the grooves 720 may include a beveled floor 722. However, a flat floor also may be included. Moreover, although the sidewalls 724 of the grooves are shown as being orthogonal to the first and second faces 710a and 710b, tapered sidewalls also may be included, wherein the cross-sectional area of the sidewall preferably decreases from the first face 710a to the second face 710b of the substrate 710.

FIG. 7C illustrates other embodiments where nonplanar features are provided. Thus, a wide saw cut or other technique can be used to form pedestals 730' that have tapered and curved sidewalls 724, curved floors 722' and/or domed first faces 710a' in the pedestals 710'. These embodiments of pedestals 730' can thereby form a lens-like structure that can reduce total internal reflection. Alternatively, rather than a curved or lens-shaped first face 710a' and/or floor 722', facets may be formed on the first face 710a' and/or the floor 722', to further enhance light extraction. Etching, saw cutting, laser cutting and/or other conventional techniques may be used to produce these structures.

Finally, as also shown in FIGS. 7A–7C, the perimeters of the first and second faces 710a, 710a' and 710b are square. However, it will be understood that other shapes may be used. For example, triangular perimeter-shaped first and second faces may be used. Moreover, although four triangular pedestals 730 are shown, two or more pedestals may be used, and preferably more than four pedestals are used in relatively large chips having an area, for example, of greater than 0.1 mm$^2$.

Figure 8A:
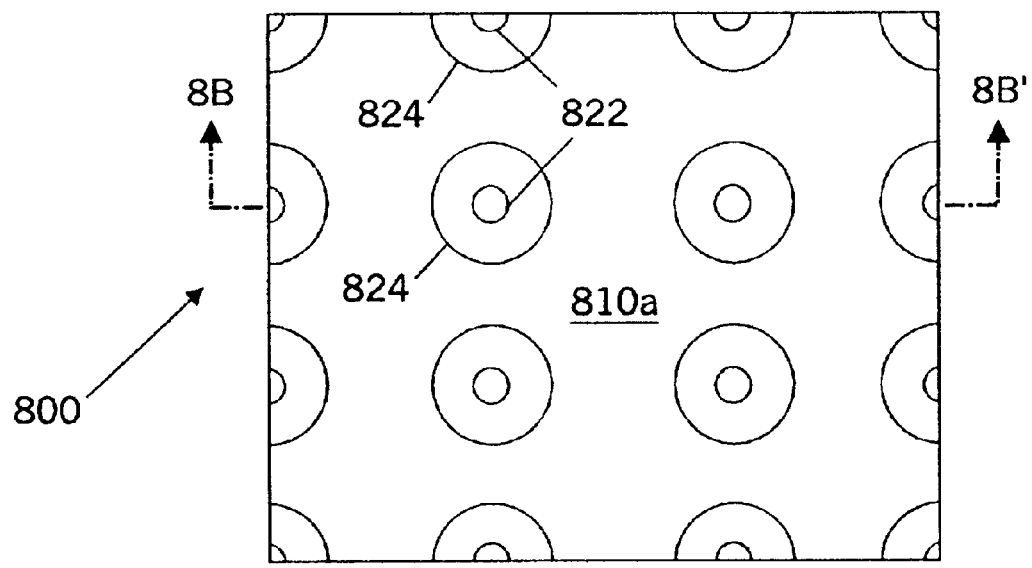
Figure 8B:
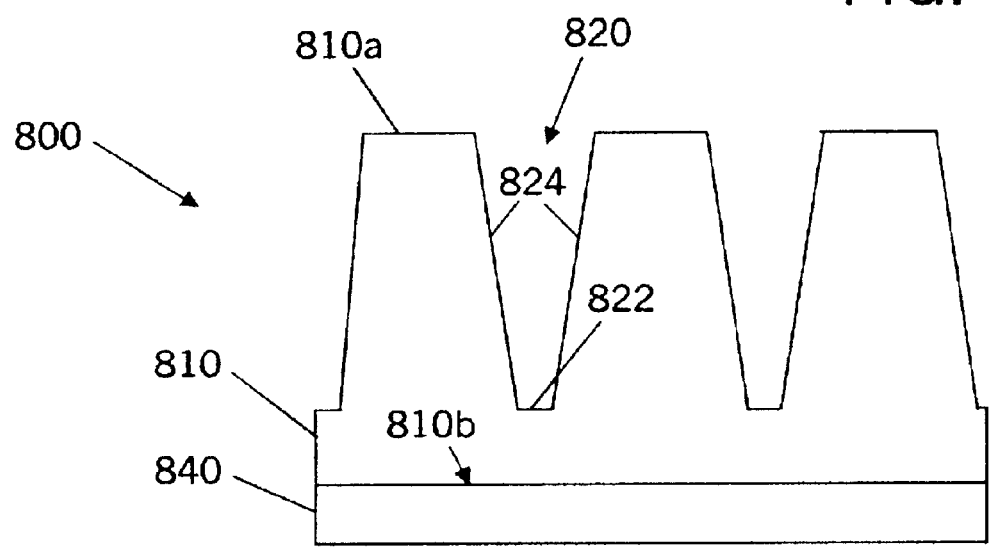

FIG. 8A is a top view of LEDs according to yet other embodiments of the present invention. FIGS. 8B and 8C are cross-sectional views of LEDs of FIG. 8A taken along line 8B–8B' of 8A, according to yet other embodiments of the present invention.

As shown in FIG. 8A, these light emitting diodes 800 include a substrate 810 having first and second opposing faces 810a and 810b, and a diode region 840 on the second face 810b. The substrate 810 may be a silicon carbide substrate, such as the silicon carbide substrate 110 that was described in connection with FIGS. 1–6, and/or any other conventional LED substrate. The diode region 840 can be a gallium nitride-based diode region 170, such as was described in FIGS. 1–5, and/or any other conventional diode region.

As shown in FIGS. 8A and 8B, the substrate 810 includes an array of via holes 820 in the first face 810a. The via holes 820 preferably extend only part way through the substrate 810, but in other embodiments, they can extend all the way through the substrate 810. As also shown, the via holes can include tapered sidewalls 824. The sidewalls 824 can be curved or straight. Moreover, curved or straight sidewalls that are orthogonal to the first and second faces 810a and 810b also may be used. The via holes 820 may have a flat, beveled and/or curved floor 822, to provide frusto-conical or cylindrical via holes. The via holes also may not include a floor 822, but rather may come to a point, to provide conical via holes. Although an array of four complete via holes and twelve partial via holes are shown in FIGS. 8A and 8B, two or more via holes 820 may be used, and more than four full via holes 820 preferably are included for large area chips, for example chips having an area greater than 0.1 mm$^2$.

As shown in FIG. 8B, the first face can be a beveled first face 810a that includes one or more facets therein. In other embodiments, the tops 810a may be rounded to provide a lens-like structure.

As will be described in detail below, the grooves 720 of FIGS. 7A–7C may be fabricated using a dicing saw, for example at a 45° angle to the chip sides, prior to or after dicing the chip. Other techniques including reactive ion etching through a mask, laser cutting, wet etching and/or other techniques may be used. The via holes 820 of FIGS. 8A–8C may be fabricated using reactive ion etching through a mask, prior to or after dicing the chip.

Light extraction through LEDs of FIGS. 7A–7C and 8A–8C now will be described. The grooves 720 or via holes 820 can allow light extraction to occur periodically across the chip, rather than just along the edges of the chip. They can, therefore, provide scalability for large area chips. This contrasts sharply from dicing grooves that are placed in a substrate to permit dicing the substrate in the grooves and also contrasts sharply from grooves that are cut through the diode region of an LED.

The pedestals, via holes, sidewalls and/or grooves can improve light extraction because the vertical edges of the chip generally play a role in light extraction. Furthermore, for purposes of light extraction, the best shape for an LED chip may not be a square or rectangular perimeter. However, LED chips generally have square perimeters for reasons of packing density within a wafer. In a square chip, a ray striking a sidewall from any direction at an angle greater than the critical angle, and less than the complement of this angle, generally will be lost to internal reflections and subsequent absorption. Cylindrical chips may reduce internal reflections, but their manufacturability and packing density may be poor. Moreover, light generated at points further from the center of a cylindrical die may increasingly produce rays that strike the vertical sidewalls tangentially. More rays are once again lost to internal reflections and absorption. The overall die area then may need to be large compared to the active central area, which may be an inefficient use of wafer area, and may lead to higher cost.

In sharp contrast, some embodiments of the present invention can form pedestals, such as equilateral or non-equilateral triangular pedestals 730, in the substrate. Excellent wafer utilization may be maintained. In particular, a generated ray may have no more than one incidence and reflection at a sidewall 724, at an angle greater than the critical angle. Angles of incidence greater than the critical angle are reflected, but they may strike the next wall at less than the critical angle in all cases, assuming that the index of refraction for the encapsulating material is about 1.5 or greater. Thus, unlike die with sides at right angles or smooth continuous arcs, no ray may be lost in its entirety to internal reflection and absorption.

LEDs having a triangular shape versus a square LED with the same chip area, running at identical currents and having smooth vertical sidewalls can, for example, yield a 15% improvement in light output. In addition, tapered sidewalls or channels can be used with the triangular pedestals, to access even more of the trapped light in the substrate. Finally, triangular pedestals that may be formed using grooves cut at 45° angles or other angles relative to the square die can allow for standard die handling and separation techniques, but can provide for the extra light extraction advantage of a non-square-shaped chip. Standard edge shaping and die separation may be used. Similar effects may be provided using an array of via holes 820.

It will be understood that the LEDs of FIGS. 7A–7C and 8A–8C may be mounted upside down or in flip-chip configuration, as was illustrated in FIGS. 2–5. Silver epoxy that may be used to couple the LED to a mounting substrate may be prevented from entering the grooves or via holes, which could reduce the efficiency thereof. In other embodiments, if the grooves and/or via holes are used with conventional, non-flip-chip LED mounting, a reflective back layer, such as silver or aluminum, can be formed on the first face of the substrate, so that light incident on the grooves or via holes will be reflected back towards and through the diode region.

Additional discussion of the use of solder preforms in the bonding regions 220/230 now will be provided. Small area LEDs may require exceptional care to prevent the silver epoxy that is used in attaching the die to the lead frame from contacting the sidewall of the chip and/or the conducting substrate. Such a contact may form a Schottky diode, which may be detrimental to the performance of vertical LED structures. The Schottky diode can shunt current around the LED because it has a lower forward turn-on voltage. The use of silver epoxy on a large chip may be more manageable than on a small chip, since over-dispensing may not cause the epoxy to come out from under the chip and possibly reach the vertical sidewall of the diode region and/or substrate. According to embodiments of the invention, a solder preform may be formed on or attached to the reflector or other layer, as will be described below. The preform may comprise a low temperature eutectic alloy, such as lead-tin, indium-gold, gold-tin and/or silver-tin solder. The preform shape can be well defined and the outward creep can be controlled by the pressure and/or temperature employed in the die attach process. Moreover, the thermal conductivity of a preform may be superior to silver epoxy, which can be advantageous for high-power devices.

Figure 9:
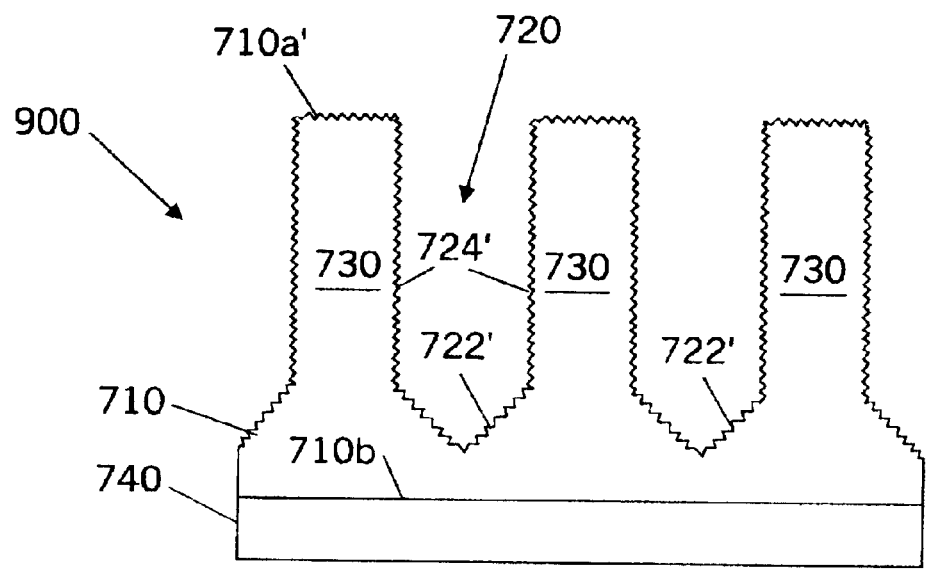
Figure 10:
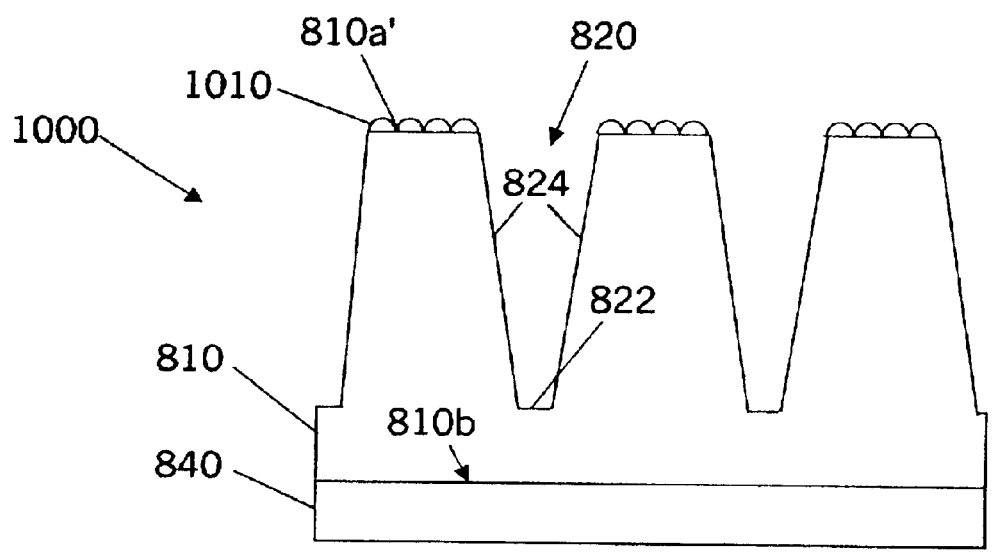

Referring now to FIGS. 9 and 10, texturing of the substrate also may be provided. The texturing may be on the order of an emission wavelength or larger. For example, as shown in FIG. 9, LEDs 900 may include a textured first face 710a' of the substrate 710. Textured sidewalls 724' and/or textured floors 722' may be provided in addition to or instead of the textured first face 710a'. As shown in FIG. 10, LEDs 1000 may include a textured first face 810a' that can include an array of microlenses 1010 thereon. Textured sidewalls and/or floors also may be provided. Any conventional technique for texturing may be used. Texturing, as described for example in connection with FIGS. 9–10, also may be used with other embodiments that are described herein.

It may be preferable for the exposed surface of the packaged LED chip to be textured and not polished. Conventional chips are packaged with a polished epitaxial side up, which can reduce light extraction therefrom. Texturing the exposed surface can provide a random probability that incident light can be transmitted instead of being internally reflected. It also will be understood that texturing the substrate backside need not preclude the formation of an ohmic contact to this substrate face. More particularly, vertical LEDs may have one contact to the active diode region and a backside contact to the backside of the substrate that is textured. Texturing of the sidewalls can provide up to 20% or more light emission compared to a polished surface.

Figure 11:
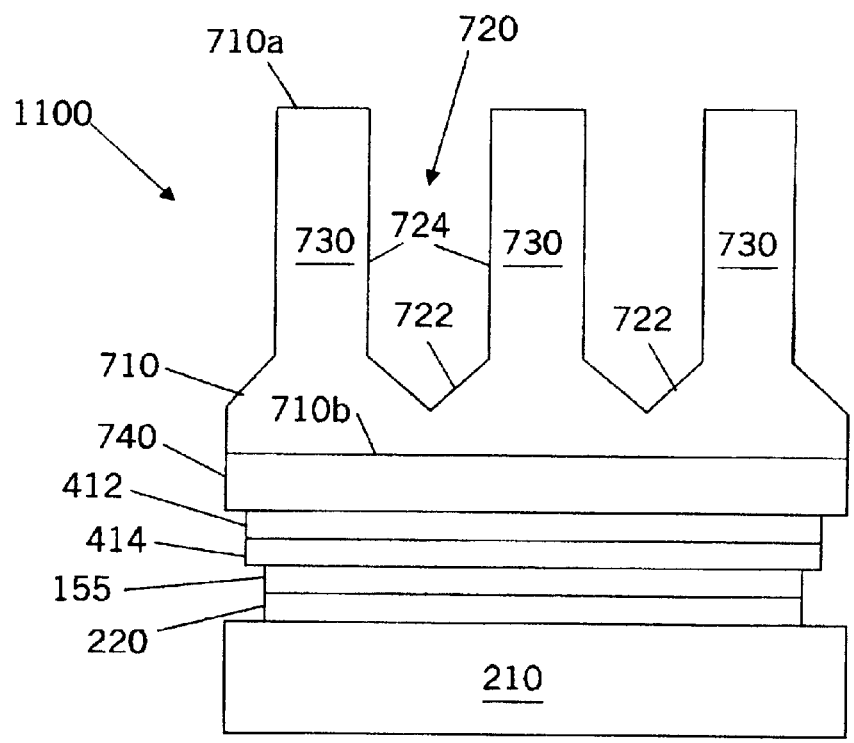
Figure 12:
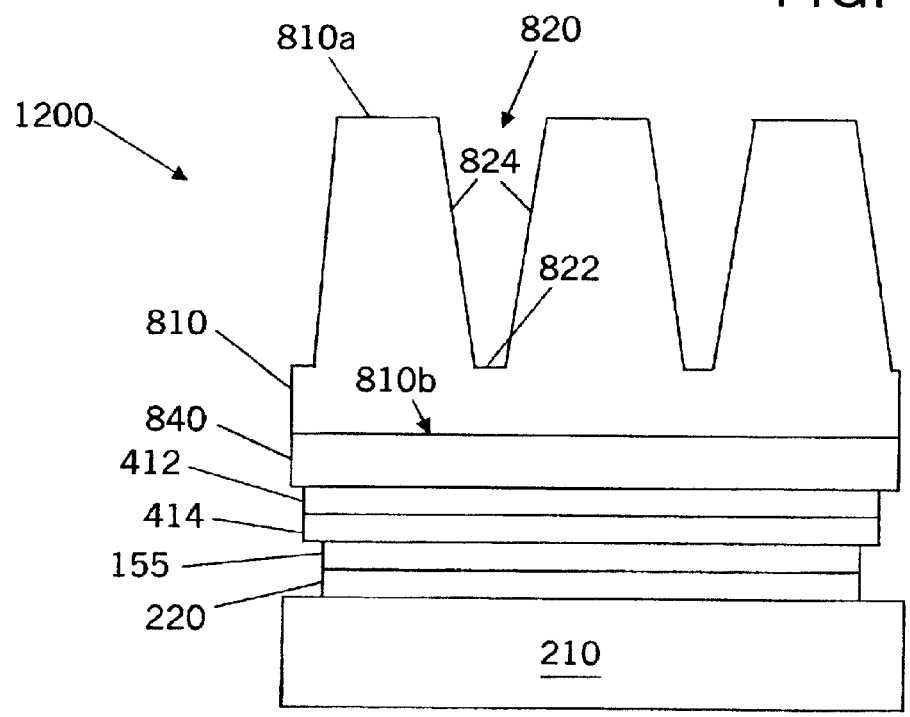

FIGS. 11 and 12 illustrate other LEDs according to embodiments of the present invention. LEDs 1100 of FIG. 11 and LEDs 1200 of FIG. 12 may correspond to the LEDs 700 of FIG. 7 and LEDs 800 of FIG. 8. However, in the embodiments of FIGS. 11 and 12, a transparent ohmic contact 412 and a reflector 414 are added. The thin transparent ohmic contact 412 can improve the current spreading of the p-type gallium nitride layer and can make ohmic contact to the anode, while preferably blocking a reduced, and more preferably a minimal, amount of light.

Moreover, in the configurations shown in FIGS. 11 and 12, since the chip is flip-chip mounted on the mounting substrate 210, the transparent ohmic contact 412 can be thinned more than may be possible in a conventional nitride LED, thus allowing it to be more transparent. A relatively thick reflector 414, comprising, for example, aluminum and/or silver, also can be provided. The reflector 414 can provide excellent current spreading. Moreover, a solder preform 220, and/or other mounting region may be used between the metal contact 155 and the mounting substrate 210, to provide electrical and mechanical connection and heat transfer from the diode region, while preventing a short circuit in the diode region, which could create a parasitic Schottky contact. It will be understood that by flip-chip mounting the diode, power dissipation need not occur through the substrate. Rather, the heat generating diode region can be in intimate contact with the heat sink, with a lower thermal resistance. In other embodiments, described, for example, in connection with FIG. 16, non-flip-chip mounting may be used. It also will be understood that a transparent/reflector electrode, solder preform and/or flip-chip mounting may be used with other embodiments of the invention described herein.

Figure 13:
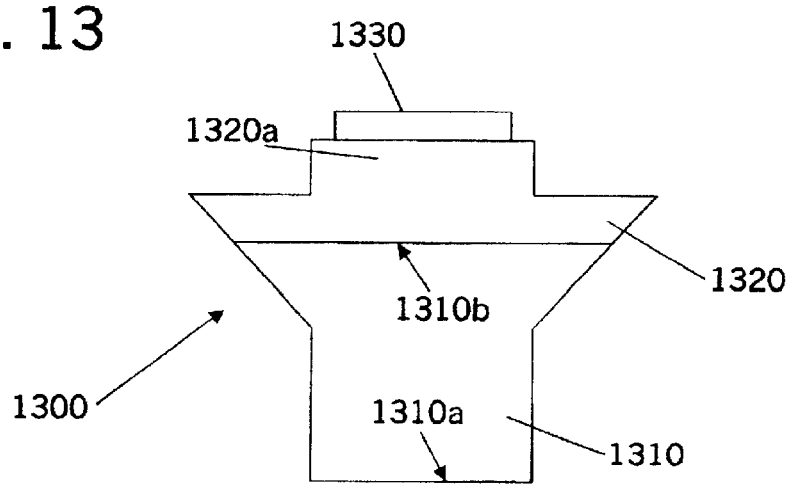
FIGS. 9–13 are cross-sectional views of light emitting diodes according to yet other embodiments of the present invention.

FIG. 13 illustrates other embodiments of the invention that can be used to improve extraction efficiency in a conventional ATON LED. As is well known to those having skill in the art, an ATON LED uses substrate shaping as described, for example, in the publication entitled *OSRAM Enhances Brightness of Blue InGaN LEDs*, Compound Semiconductor, Volume 7, No. 1, February 2001, p. 7. In particular, as shown in FIG. 13, a conventional ATON LED 1300 includes a substrate 1310 and a diode region 1320. According to embodiments of the invention, an emission region, defined, for example, by a mesa 1320a and/or an electrode 1330, is included only in a central portion of the diode region, and is excluded from peripheral portions of the diode region. The electrode 1330, preferably a transparent electrode, can be coextensive with, or smaller than, the emission region 1320a. Other techniques for reducing the area of the emission region also may be used.

Stated differently, the substrate 1310 has first and second opposing faces 1310a and 1310b, respectively. The first face 1310a has smaller surface area than the second face. A diode region 1320 is on the second face 1310b. An emission region 1320a is included in the diode region 1320 and is confined to within the smaller surface area of the first face 1310a. This configuration can make the chip look more like a point source at a focal point of a lens. Conventionally, light generated at the edges of the chip does not obtain much of a benefit of the shaped edges, since a smaller solid surface of emitted light interacts with those surfaces, compared to light generated in the center of the chip. Simulations show that about 20% more light output can be obtained by bringing the emission region in from the chip edges. This increased extraction efficiency of a reduced emission area also can make the light output less sensitive to losses in the substrate and at the substrate surface, since more light can escape on the first pass out of the active region. Embodiments of FIG. 13 may be used for conventional non-flip-chip packaging. Embodiments of ATON LEDs that may be used for flip-chip packaging will be described in connection with FIG. 17 below.

Figure 14A:
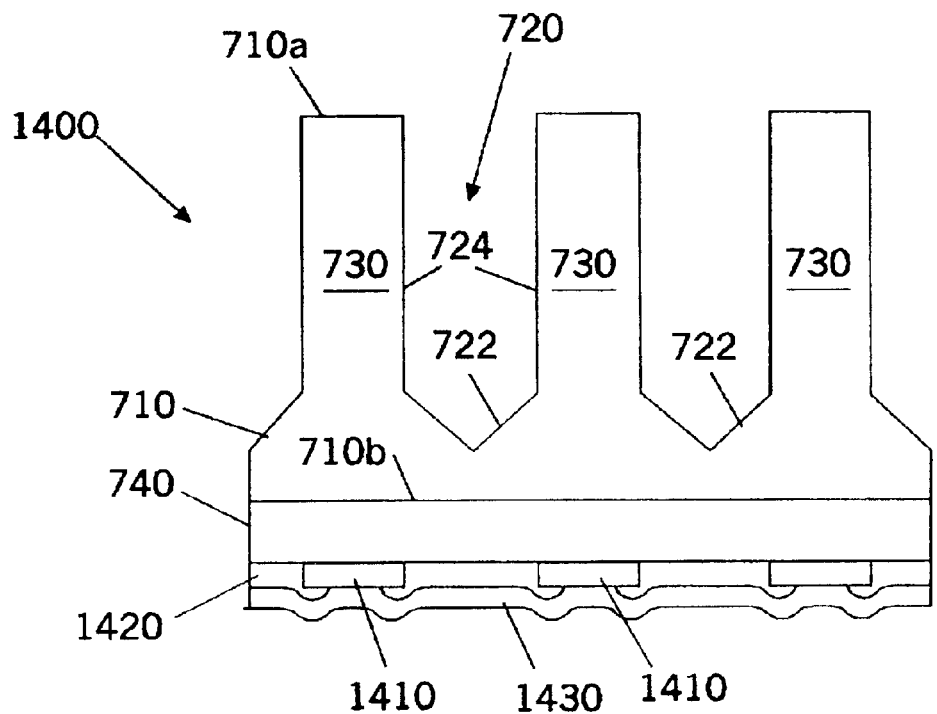
FIG. 14A a cross-sectional view taken along the lines 14A–14A' of FIG. 14B, which is a bottom view of light emitting diodes according to still other embodiments of the present invention.
Figure 14B:
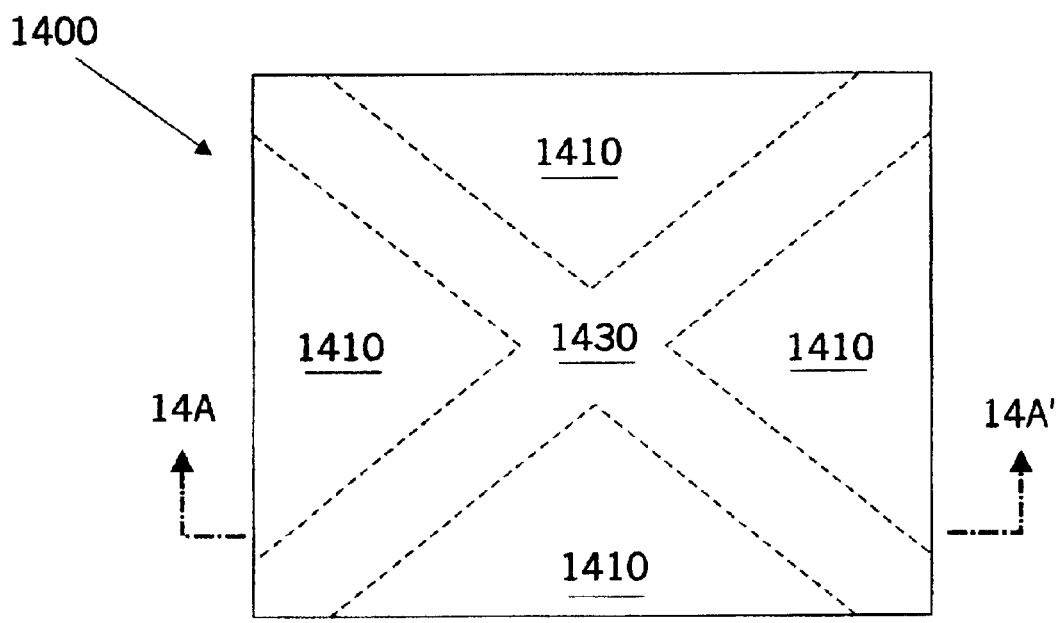

FIG. 14A illustrates application of a reduced emission area to other embodiments of the invention. For example, LEDs 1400 are similar to LEDs 700 of FIG. 7, except that at least one reduced emission area is provided according to embodiments of the invention. At least one reduced emission area may be provided by one or more conductive electrodes 1410 that are aligned with the pedestals 730. The conductive electrodes 1410 may comprise platinum and/or other materials. An insulating layer 1420, for example comprising silicon nitride, may be used to prevent metal contact to the diode region 740. An interconnect metal layer 1430 may be blanket formed on the conductive electrodes 1410 and on the silicon nitride layer 1420. It will be understood that the interconnect layer 1430 also may act as a reflective layer. Alternatively, one or more separate reflective layers may be provided. FIG. 14B is a bottom view of the LEDs of FIG. 14A, illustrating the conductive electrodes 1410 and the metal layer 1430. It also will be understood that in other embodiments of the invention, at least one mesa 1320a of FIG. 13 may be included in the diode region 740 of FIG. 14A, to provide at least one reduced emission area. Moreover, reduced emission areas may be used with other embodiments of the invention that are described herein.

Thus, efficiency of LEDs can be improved by reducing the emission area to be confined more in the central portions of the back-shaped regions. For a back-shaped device with a uniform emission area, much of the emission occurs over the shaped regions of the chip which may be less efficient. In contrast, in FIGS. 14A and 14B, since the emission region or regions are aligned to the pedestals 730, improved extraction efficiency may be provided. Since the conductive electrodes 1410 are disconnected from each other, they may need to be connected with an interconnecting conductive metal 1430. If the device is flip-chip bonded, the conductive metal 1430 can be the solder- and/or silver-loaded epoxy. If the device is mounted in non-flip-chip configuration, a metal sheet such as a reflector, metal strips and/or wire bonds may be included for interconnection.

Figure 15A:
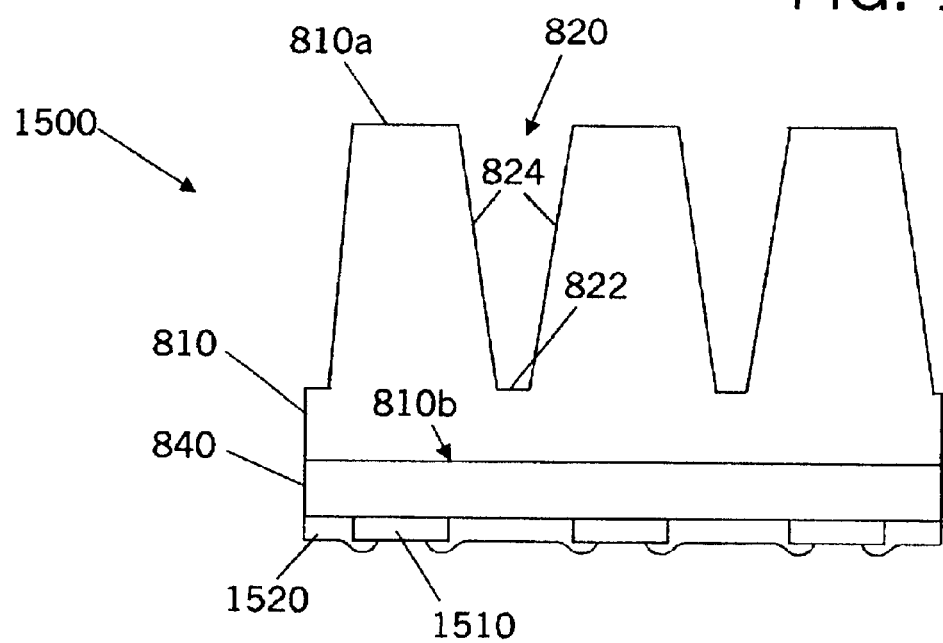
FIG. 15A a cross-sectional view taken along the lines 15A–15A' of FIG. 15B, which is a bottom view of light emitting diodes according to yet other embodiments of the present invention.
Figure 15B:
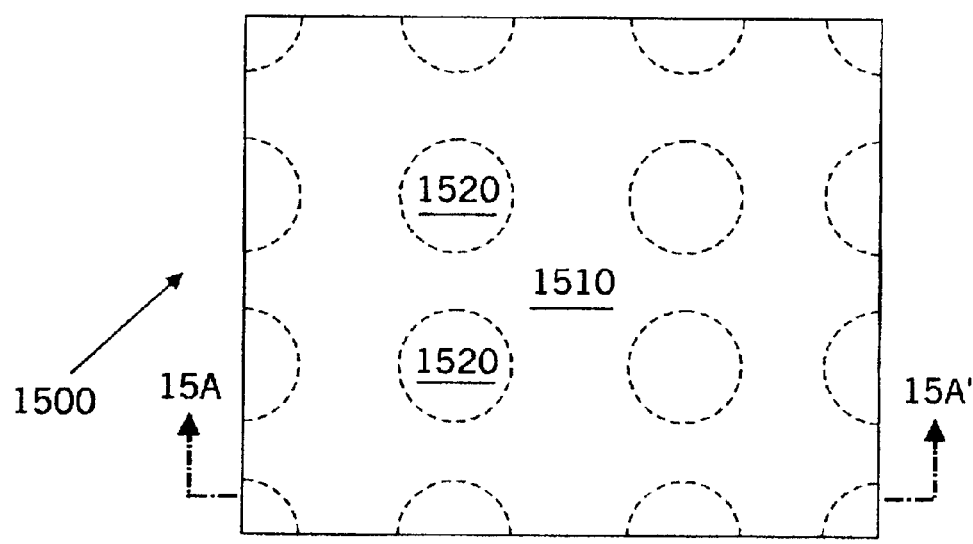

FIG. 15A illustrates application of at least one reduced emission area to yet other embodiments of the invention. For example, LEDs 1500 are similar to LEDs 800 of FIG. 8, except that at least one reduced emission area is provided according to embodiments of the present invention. At least one reduced emission area may be provided by a conductive electrode 1510 that does not overlap the via holes 820. The conductive electrode 1510 may comprise platinum and/or other materials. An insulating layer 1520, for example comprising silicon nitride, may be used to prevent metal contact over the areas defined by the via holes 820. FIG. 15B is a bottom view of the LEDs of FIG. 15A, illustrating the conductive electrode 1510 and the insulating regions 1520. As was the case with FIG. 14A, in other embodiments, at least one mesa 1320a of FIG. 13 may be included in the diode region 840 of FIG. 15A, to provide at least one reduced emission area.

It will be understood that embodiments according to the present invention can be used to improve sapphire-based nitride LEDs as well as LEDs based on other material systems, as was described above. However, in sapphire-based nitride LEDs, most of the light may remained trapped in the higher index nitride diode region. The gains may be greater for silicon carbide, gallium nitride, aluminum nitride, zinc oxide and/or other substrates where the index of refraction of the substrate is higher than that of sapphire. Thus, embodiments of the invention may not be limited to the use of silicon carbide as a substrate. It will be understood that when sapphire is used as a substrate, the insulating layer of sapphire may use two contacts to the diode region, such as was illustrated in FIG. 1. These contacts may need to be aligned to their electrical connections in the package. The transparency of a sapphire substrate can facilitate the alignment if the exposed side is polished. However, a polished exposed surface may be less efficient for extracting light than a textured one.

Figure 16:
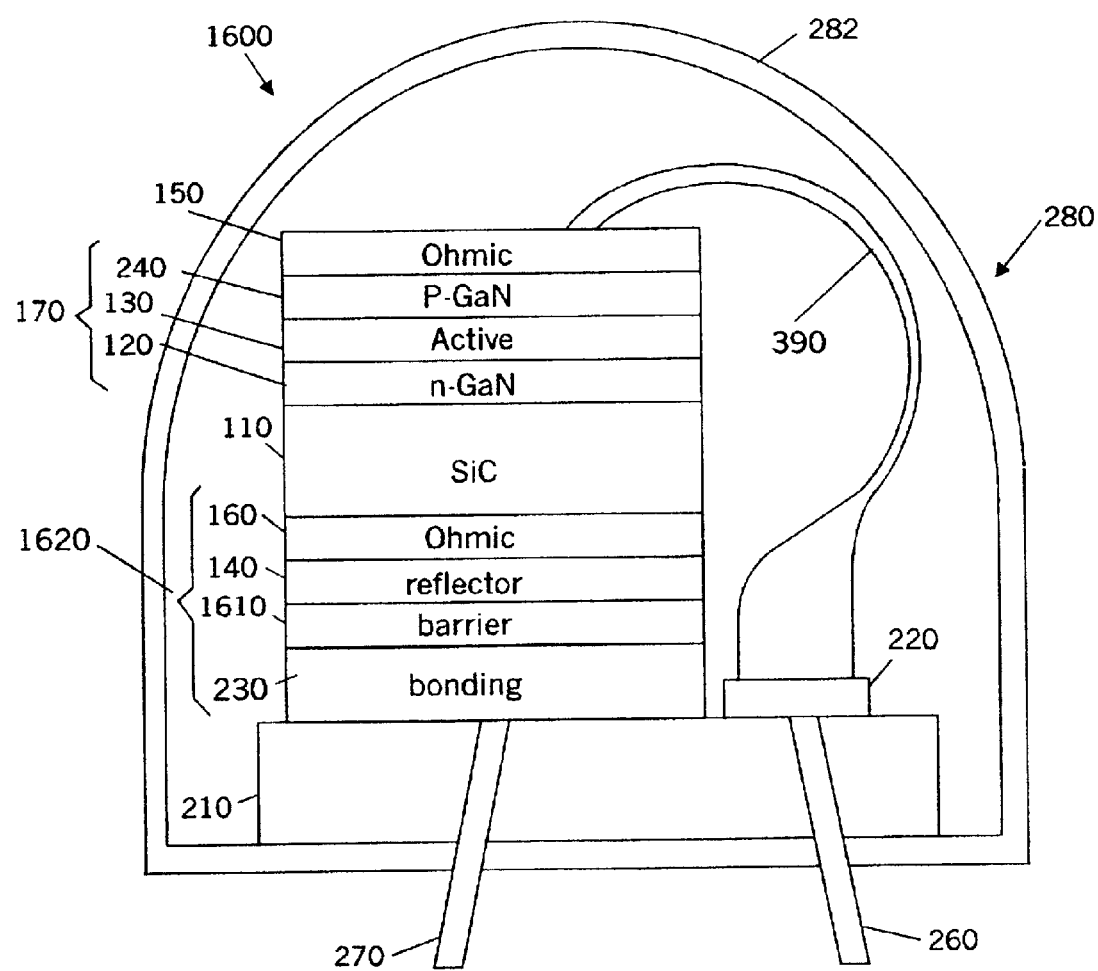
FIGS. 16, 17A and 18 are cross-sectional views of light emitting diodes according to still other embodiments of the present invention.

FIG. 16 is a cross-sectional view of light emitting diodes according to other embodiments of the present invention is shown. FIG. 16 may be regarded as similar to FIG. 3, except the light emitting diode 1600 is configured for non-flip-chip mounting, rather than flip-chip mounting. Moreover, other contact structures between the LED and a mounting support, such as a mounting or sub-mounting assembly, also are shown. It will be understood that the non-flip-chip mounting of FIG. 16 and/or the contact structures of FIG. 16 may be used with other embodiments of the invention that are described herein, and/or with other conventional LEDs.

More specifically, referring to FIG. 16, the light emitting diode 1600 is mounted on a mounting support 210 in a non-flip-chip orientation, wherein the silicon carbide substrate 110 is adjacent the mounting support 210, and the diode region 170 is on the silicon carbide substrate 110 opposite or remote from the mounting support 210. Stated differently, the diode region 170 is up, and the silicon carbide substrate 110 is down. It has been found, according to embodiments of the invention that are illustrated in FIG. 16, that the amount of light that may be extracted from a conventional non-flip-chip mounted LED can be increased when a transparent silicon carbide substrate 110 is used. In these embodiments, light from the active region 130 of the diode region 170 that is generated downward into the silicon carbide substrate 110, is reflected back through the silicon carbide substrate 110 via a reflector 140. Although the extraction efficiency may be less than LEDs 300 of FIG. 3, extraction efficiencies greater than those of conventional LEDs that do not employ transparent silicon carbide substrates 110, may be obtained. It will be understood that a right-side-up mounting of FIG. 16, with the transparent silicon carbide substrate adjacent a mounting region and the diode region remote from the mounting region, also may be used with other conventional LED configurations.

Still referring to FIG. 16, contact structures 1620 according to embodiments of the invention now will be described. It will be understood that these contact structures 1620 may be used with other embodiments that are described herein, and also may be used with other conventional LED structures.

As shown in FIG. 16, the contact structure 1620 includes an ohmic region 160, a reflector 140, a barrier region 1610, and a bonding region 230. A top ohmic contact 150 also is provided. The ohmic contacts 150/160 preferably are a transparent layer or layers of metal, such as a thin layer of platinum, which may be between about 10 Å and about 100 Å thick. Other transparent ohmic contacts 150/160 may be used. For example, transparent oxides, such as indium tin oxide (ITO) may be used, in which case the thickness of the ohmic contact 150/160 may be up to several microns or more thick. The ohmic contact 150/160 can be a uniformly thick layer, a grid structure and/or a dot structure, for example as described in U.S. Pat. No. 5,917,202 to Haitz et al., the disclosure of which is hereby incorporated herein by reference in its entirety as if set forth fully herein. The ohmic contacts 150/160 preferably provide current spreading, to facilitate efficient and uniform current injection into the active region 170. When a grid or dot structure is used for the ohmic contacts 150/160, current spreading may be achieved if the silicon carbide substrate 110 has properly matched conductivity. Grid/dot ohmic regions can reduce or minimize the light absorption in the ohmic region due to reduced area coverage. It also will be understood that the configurations of the ohmic contacts 150 and 160 need not be identical.

Still referring to FIG. 16, the reflector 140 can comprise, for example, between about 100 Å and about 5000 Å of reflecting metal, such as silver and/or aluminum, and/or a mirror stack as was already described. It also will be understood that the functionality of the ohmic region 160 and the reflector 140 can be combined in a single ohmic and reflector region, such as a single layer of silver or aluminum, which can concurrently provide a current spreading and a reflecting function. Alternatively, different layers may be used for the ohmic region 160 and the reflector 140.

Still referring to FIG. 16, a barrier region 1610 also may be provided that protects the reflector 140 and/or the ohmic region 160 from diffusion and/or spiking from an underlying die attach. Thus, the barrier region 1610 can preserve the optical and/or electrical integrity of the ohmic region 160 and/or the reflector 140. In some embodiments, the barrier region includes between about 100 Å and about 5000 Å of nickel, nickel/vanadium and/or titanium/tungsten.

Finally, still referring to FIG. 16, a bonding region 230 is provided that adheres the semiconductor LED structure to a mounting support 210, such as a mounting or sub-mounting assembly. The bonding region 230 can be a metal layer comprising, for example, gold, indium, solder, and/or braze, and may include a preform of one or more of these and/or other structures. In some embodiments, the bonding region 230 can include solder bumps and/or other metal bumps, such as indium or gold. The mounting support 210 may include a heat sink, a Surface Mount Technology (SMT) package, a printed circuit board, a driver integrated circuit, a lead frame and/or other conventional mounting and/or sub-mounting assemblies that are used for LEDs. The bonding region 230 can be adhered to the mounting support 210, using silver epoxy, solder bonding, thermo-solder bonding and/or other techniques. It also will be understood that embodiments of contact structures 1620 of FIG. 16 may be used with flip-chip-mounted LEDs and/or other conventional LED structures.

Figure 17B:
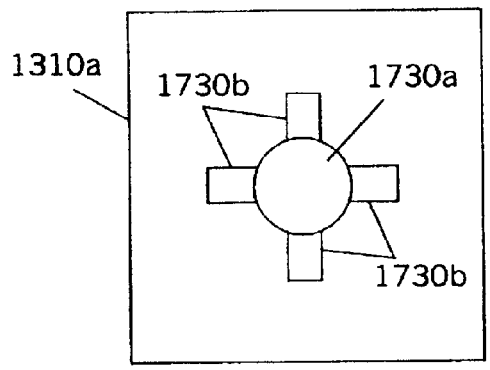
FIG. 17B is a top view of FIG. 17A according to embodiments of the present invention.
Figure 17A:
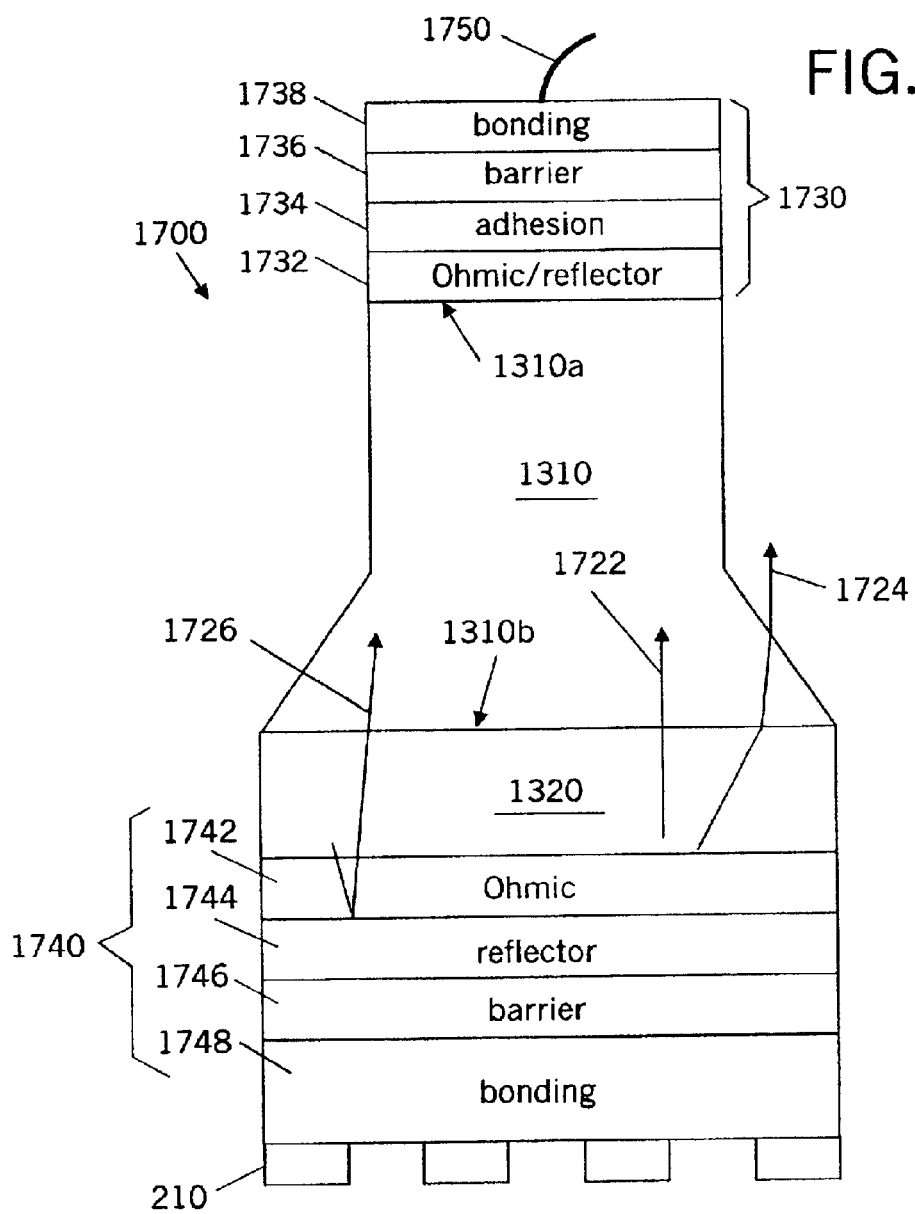

FIG. 17A is a cross-sectional view of light emitting diodes according to still other embodiments of the present invention. More specifically, FIG. 17A illustrates a conventional ATON LED that is flip-chip-mounted and/or employs a contact structure according to embodiments of the present invention. Flip-chip-mounting such as was shown, for example, in FIG. 2, and/or contact structures, such as were illustrated in FIG. 16, may be used.

Referring now to FIG. 17A, these embodiments of LEDs 1700 include a transparent substrate 1310 such as a colorless, compensated silicon carbide substrate, and a diode region 1320 that is flip-chip-mounted on a mounting support 210, such that the diode region 1320 is adjacent the mounting support 210, and the silicon carbide substrate 1310 is remote from the mounting support 210. The diode region 1320 may include a reduced emission area such as a mesa area 1320a of FIG. 13.

Flip-chip mounting, as shown in FIG. 17A, can provide improved light extraction compared to conventional non-flip-chip mounted LEDs. For example, in conventional chips that use gallium nitride regions on silicon carbide substrates, about half of the light that is generated internally in the LED active region may actually be emitted. The remainder may be trapped in the semiconductor material, due to total internal reflection and/or absorption losses. A configuration wherein the first face of the silicon carbide substrate, remote from the diode region, has smaller surface area than the second face of the silicon carbide substrate, adjacent the diode region, can enhance light extraction. However, a significant portion of the emitted light is incident and/or passes through chip faces that are completely and/or partially covered with absorbing metal, to facilitate the ohmic contact to the LED p- and n-regions. Moreover, a conventional LED directs light primarily downward, which may cause an additional reflection from optical elements in the LED package, and/or loss due to the die attach material. These phenomena may cause additional optical losses.

In sharp contrast, embodiments of the invention as illustrated in FIG. 17A can employ an ATON geometry and/or other geometries that include a reduced area first face 1310a compared to the second face 1310b, that is flip-chip mounted to a mounting support 210, such that the diode region 1320 is adjacent the mounting support 210, and the substrate 1310 is remote from the mounting support 210.

Moreover, as also shown in FIG. 17A, additional efficiency may be obtained by using p-contact structures 1740 that include a p-ohmic region 1742, a reflector 1744, a barrier region 1746 and/or a bonding region 1748. In some embodiments, the p-ohmic region 1742 may comprise a p-ohmic metal, such as nickel/gold, nickel oxide/gold, nickel oxide/platinum, titanium and/or titanium/gold, between about 10 Å and about 100 Å thick. In some embodiments, the p-ohmic region 1742 can comprise a continuous or non-continuous p-ohmic metal, with an area coverage of between about 10% and about 100%, and a thickness of between about 2 Å and about 100 Å. For non-continuous p-ohmic metals, the conductivity of the underlying diode's layers may be matched to the area coverage, to enhance the uniformity of current injection into the diode-active region.

Still referring to FIG. 17A, a thick reflector 1744 such as silver and/or aluminum is on the ohmic region 1742, opposite the diode region 1320. In other embodiments, the ohmic region 1742 can be thick enough to facilitate a low contact resistance, but thin enough to reduce optical absorption. The ohmic region 150 may be equal to or less than half the ohmic metal thickness of a conventional ATON chip, to accommodate the double pass of the light through the contact. Moreover, the current spreading function can be assumed by a combined ohmic and reflector region, which can be designed to be thick enough to facilitate efficient optical reflection of the light generated in the diode region 1320, and simultaneously provide the current spreading. Thus, light 1726 that is generated in the diode region 1320 can reflect off the reflector 1742 back into the substrate 1310. Other light 1722 generated in the diode region can be injected directly into the substrate 1310. Yet other light 1724 can emerge from the oblique sidewalls of the substrate.

Still referring to FIG. 17A, the flip-chip mounted LED can be die attached using a bonding region 1748 that can include gold, indium, conventional epoxy materials, braze and/or solder with the use of appropriate solder and/or solder barrier regions 1746, such as nickel, nickel/vanadium and/or titanium tungsten. An optional adhesion layer, comprising, for example, titanium, also may be provided between barrier layer 1746 and bonding region 1748. It also will be understood that, by providing reflective metal on the semiconductor surface, a very smooth mirror surface may be achieved which has relatively high reflectivity compared to the relatively rough surface of the header.

Still referring to FIG. 17A, an n-contact structure 1730 may be used that includes an ohmic/reflector region 1732, an adhesion region 1734, a barrier region 1736 and a bonding region 1738. The ohmic/reflector region 1732 may comprise an n-ohmic material, such as aluminum and/or silver about 1000 Å thick. This ohmic/reflector region 1732 may act as an ohmic contact and as a reflector layer. An optional reflector region also may be provided that is similar to the reflector region 1724. An optional adhesion region 1734 comprising, for example, about 1000 Å of titanium, may be provided. A barrier region 1736 also may be provided. For example, about 1000 Å of platinum may be used. Finally, a bonding region 1738 may be used. For example, up to 1 $\mu$m or more of gold may be used, and a conventional wire bond 1750 may be attached to the bonding region 1738. It also will be understood that one or more of the regions 1732, 1734, 1736 or 1738 may be eliminated or combined with other regions, depending upon the particular application.

Flip-chip mounted ATON chips according to embodiments of FIG. 17A can produce about 1.5 to about 1.7 times or more enhanced radiometric flux compared to a conventional non-flip-chip ATON geometry. Absorption in the p-electrode and/or die attach material can be reduced. An n-contact structure 1730 may be used that can reduce or minimize the surface coverage. Thus, in some embodiments, an electrode structure 1730 can occupy the entire first face 1310a of the silicon carbide substrate 1310. However, other geometrical configurations may be used to reduce or minimize the surface coverage.

For example, as shown in FIG. 17B, the n-contact structure 1730 may include only a central portion 1730a on the first face 1310a. However, for larger chip sizes, fingers 1730b of the n-contact structure 1730 also may be employed to provide additional current spreading. Thus, the n-contact structure 1730 may occupy the full area of the first face 1310. In other embodiments, less than the full area may be occupied, but more than 10% of the area may be occupied. In still other embodiments, less than 10% of the area may be used. It also will be understood that many other geometric configurations of central portions 1730a and fingers 1730b may be provided.

To allow enhanced scalability, the n-contact structure 1730 can be an interconnected grid structure that is matched in surface coverage and current spreading resistant to the conductivity of the underlying semiconductor material 1310. By reducing and preferably minimizing the surface coverage of the n-contact structures 1730 and employing silver and/or aluminum reflectors 1732, the absorption of the completed n-contact structures 1730 can be reduced and preferably minimized.

It will be understood that, in other embodiments, both the n- and p-electrodes may be formed on the side of the chip, for example, as described in U.S. Pat. No. 5,952,681 to Chen. This may further reduce the light absorption in the ohmic contacts for the n-electrode.

It also will be understood that flip-chip mounting and/or contact structures of FIGS. 17A and 17B may be used with other substrate geometries including cubic, triangular, pyramidal, truncated pyramidal and/or hemispherical, with reduced area first faces. Additional first face patterning in the form of grooves, via holes and/or other patterning features also may be provided, as was already described. Finally, texturing and/or roughening, as was already described, also may be employed. Roughening of the substrate and/or the diode region may be employed. Thus, the reflector 1744 may be formed on an intentionally roughened and/or patterned diode region 1320. This random roughness can enhance light extraction and/or decrease internal reflections. A specific pattern, such as a Fresnel lens, also may be used to direct the reflected light and/or enhance light extraction. The patterning can form an optical element once the reflector 1744 is applied. The dimension of the pattern may be on the order of a wavelength of the light that is emitted from the LED.

Figure 18:
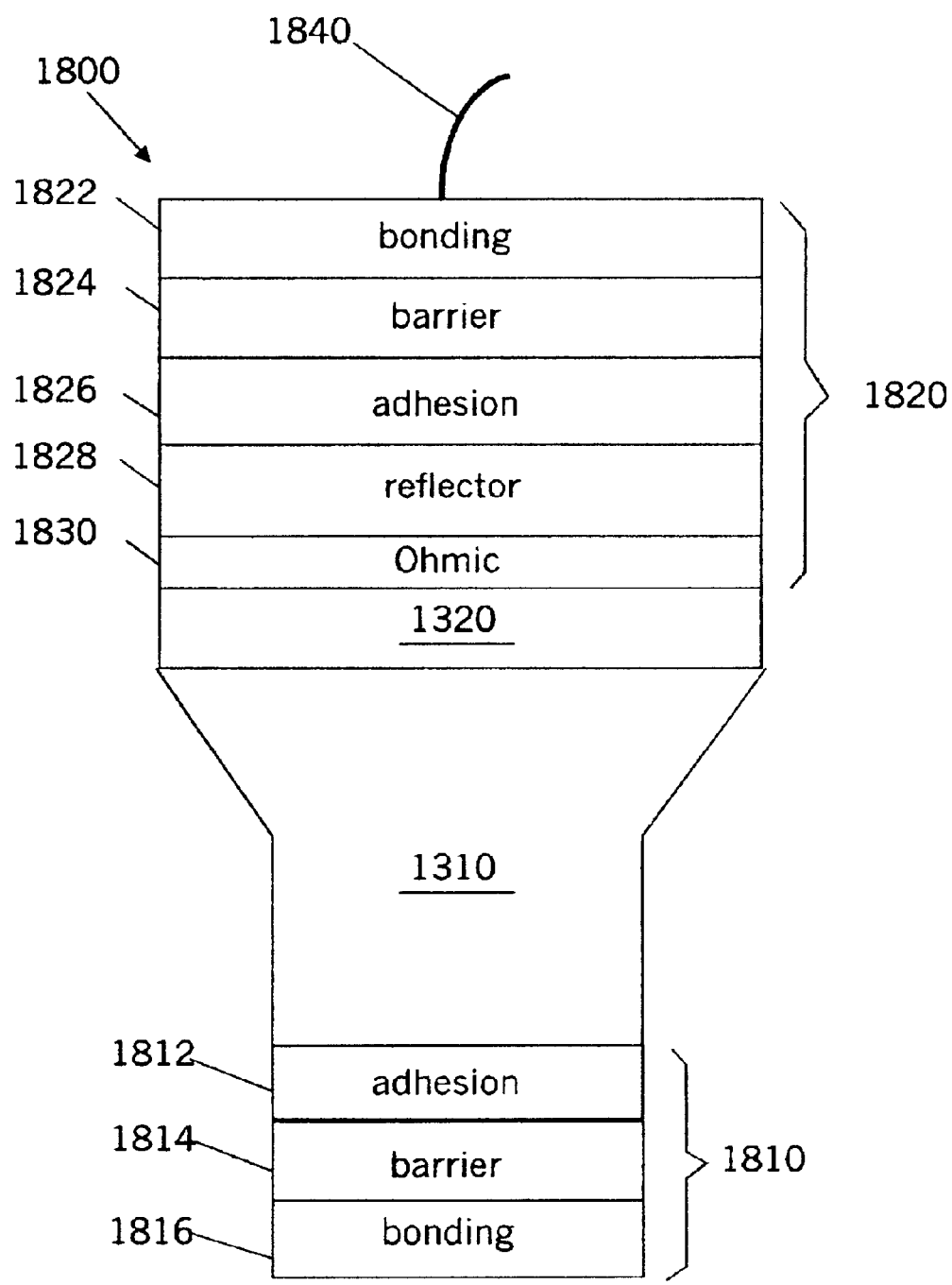

FIG. 18 is a cross-sectional view of light emitting diodes according to still other embodiments of the present invention. More specifically, FIG. 18 illustrates a conventional ATON LED that includes a reflector on the diode region thereof. It has been found, unexpectedly, according to embodiments of the invention, that by adding a reflector to the diode region of a conventional right-side-up ATON and/or other LED, an increase in brightness of about 10% or more may be obtained compared to a conventional ATON and/or other LED that does not have a reflector on the diode region at the top surface thereof. Thus, by at least partially blocking the top surface with a reflector, increased light emission actually may be obtained.

More specifically, referring to FIG. 18, these LEDs 1800 include a substrate 1310 and a diode region 1320 according to any of the embodiments described herein and/or according to conventional ATON and/or other LED configurations. An n-contact structure 1810 may be provided, according to conventional ATON and/or other configurations. Alternatively, an n-contact structure 1810, comprising an adhesion region 1812, such as about 1000 Å of titanium, a barrier region 1814, such as about 1000 Å of platinum and a bonding region 1816 such as about 1 μm of gold, may be provided. The adhesion region 1812 also can function as an ohmic contact and may additionally be reflective.

Still referring to FIG. 18, a p-contact structure 1820 may be provided. The p-contact structure 1820 may include a transparent ohmic region 1830 that can be similar to the ohmic layer 1742 of FIG. 17A. An adhesion layer 1826, which can be similar to the adhesion layer 1734 of FIG. 17A, also may be included. A barrier layer 1824, which may be similar to barrier layer 1736 of FIG. 17A, also may be included. A bonding region 1822, which is similar to the bonding region 1738 of FIG. 17A, and a wire 1840, which may be similar to the wire 1750 of FIG. 17A, also may be included. Moreover, conventional ATON/ITP ohmic contact structures also may be provided. According to some embodiments of the present invention, the p-contact structure 1820 includes a reflector 1828 therein, to reflect light back through the diode region 1320 and into the substrate 1310. The reflector 1828 may be similar to the reflector 1746 of FIG. 17A. As was described above, unexpectedly, by adding a reflector 1828 to the top surface of the ATON and/or other LED, increased brightness, such as between about 1.2 and about 1.3 times or more the brightness of a conventional ATON LED, may be obtained.

Figure 19:
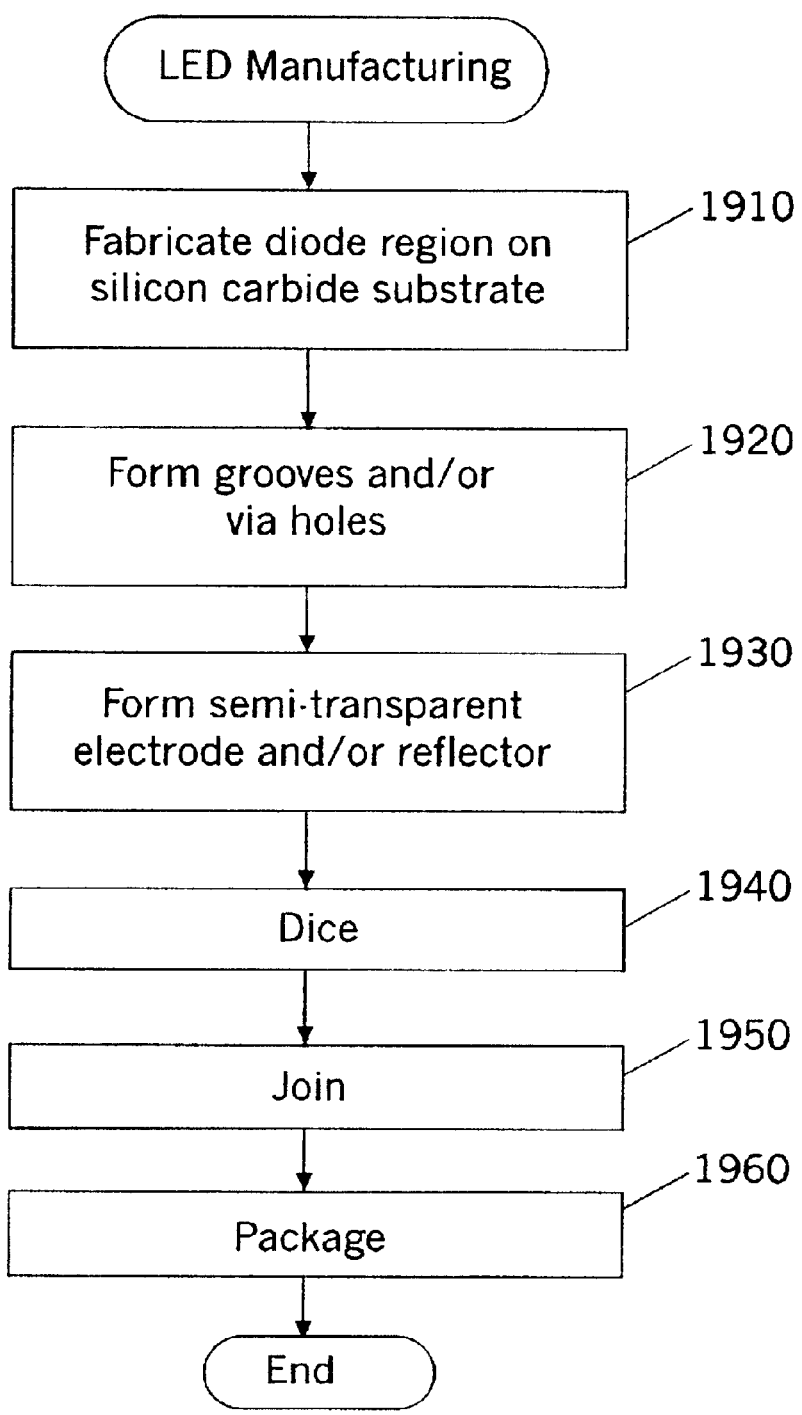
FIG. 19 is a flowchart illustrating manufacturing methods for light emitting diodes according to embodiments of the present invention.

Referring now to FIG. 19, LED fabrication methods according to embodiments of the present invention now will be described. It will be understood that some of the blocks of FIG. 19 may occur in a different order from that which is shown, and some blocks may be performed simultaneously rather than sequentially.

Referring now to FIG. 19 at Block 1910, a diode region is formed on a silicon carbide substrate. Preferably, a gallium nitride diode region is fabricated on a silicon carbide substrate, as described above. At Block 1920, grooves are sawed, etched, laser cut, reactive ion etched, wet etched and/or otherwise cut, and/or reactive ion etching is performed to form via holes on the first face of the substrate, as was described in connection with FIGS. 7–12 and 14–15. It will be understood that the grooves and/or via holes may be formed at Block 1920 prior to fabricating the diode region on the substrate and/or after fabricating the diode region on the substrate.

Referring now to Block 1930, a contact structure is formed, for example as was described in connection with FIGS. 2–5, 11–12 and 16–17. It will be understood that the contact structure may be formed prior to forming grooves and/or reactive ion etching the via holes of Block 1920.

Referring now to Block 1940, dicing is performed to separate individual LED chips. It will be understood that dicing need not be performed if a wafer size LED is being fabricated and dicing may be performed prior to forming the electrode structure of Block 1930 and/or prior to sawing the grooves and/or reactive ion etching at Block 1920.

Then, referring to Block 1950, the diode is joined to a mounting support, for example using a solder preform and/or other joining techniques, for example as was described in connection with FIGS. 2–5, 11–12 and 16–17. At Block 1960, the diode is then packaged, for example in a plastic dome, as was illustrated in FIGS. 2–3 and 16. LEDs having high extraction efficiency thereby can be manufactured efficiently.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A light emitting diode comprising:
    a substrate having first and second opposing faces, the first face having smaller surface area than the second face;
    a diode region on the second face;
    a first ohmic layer on the first face opposite the diode region;
    an adhesion layer on the first ohmic layer opposite the substrate;
    a first barrier layer on the adhesion layer opposite the first ohmic layer;
    a first bonding layer on the first barrier layer opposite the adhesion layer;
    a second ohmic layer on the diode region opposite the substrate;
    a reflector layer on the second ohmic layer, opposite the diode region;
    a second barrier layer on the reflector layer opposite the second ohmic layer; and
    a second bonding layer on the second barrier layer opposite the reflector layer.

2. A light emitting diode according to claim 1 further comprising a mounting support on the second bonding layer opposite the second barrier layer.

3. A light emitting diode according to claim 1 wherein the second ohmic layer comprises a second ohmic and reflector layer.

4. A light emitting diode according to claim 1 wherein the first ohmic layer comprises a reflective metal.

5. A light emitting diode according to claim 1 wherein the adhesion layer comprises titanium.

6. A light emitting diode according to claim 1 wherein the first barrier layer comprises platinum.

7. A light emitting diode according to claim 1 wherein the first bonding layer comprises gold.

8. A light emitting diode according to claim 1 wherein the second ohmic layer comprises nickel/gold, nickel oxide/gold, nickel oxide/platinum, titanium and/or titanium/gold.

9. A light emitting diode according to claim 1 wherein the reflector layer comprises silver and/or aluminum.

10. A light emitting diode according to claim 1 wherein the second barrier layer comprises nickel, nickel/vanadium and/or titanium/tungsten.

11. A light emitting diode according to claim 1 wherein the second bonding layer comprises gold, indium, solder and/or braze.

12. A light emitting diode according to claim 1 wherein the first ohmic layer, the adhesion layer, the first barrier layer and the first bonding layer each comprises a central portion and at least one finger that extends from the central portion.

13. A light emitting diode comprising:
    a substrate having first and second opposing faces, the first face having smaller surface area than the second face;
    a diode region on the second face;
    a first layer comprising silver and/or aluminum on the first face opposite the diode region;
    a second layer comprising titanium on the first layer opposite the substrate;
    a third layer comprising platinum on the second layer opposite the first layer;
    a fourth layer comprising gold on the third layer opposite the second layer;
    a fifth layer comprising nickel/gold, nickel oxide/gold, nickel oxide/platinum, titanium and/or titanium/gold on the diode region opposite the substrate;
    a sixth layer comprising silver and/or aluminum on the fifth layer, opposite the diode region;
    a seventh layer comprising nickel, nickel/vanadium and/or titanium/tungsten on the sixth layer opposite the fifth layer; and
    a eighth layer comprising gold, indium, solder and/or braze on the seventh layer opposite the sixth layer.

14. A light emitting diode according to claim 13 further comprising a mounting support on the eighth layer opposite the seventh layer.

15. A light emitting diode comprising:
    a substrate having first and second opposing faces, the first face having smaller surface area than the second face;
    a diode region on the second face;
    a first adhesion layer on the first face opposite the diode region;
    a first barrier layer on the first adhesion layer opposite the substrate;
    a first bonding layer on the first barrier layer opposite the first adhesion layer;
    an ohmic layer on the diode region opposite the substrate;
    a reflector layer on the ohmic layer opposite the diode region;
    a second adhesion layer on the reflector layer opposite the ohmic layer;
    a second barrier layer on the second adhesion layer opposite the reflector layer; and
    a second bonding layer on the second barrier layer opposite the second adhesion layer.

16. A light emitting diode according to claim 15 further comprising a mounting support on the first bonding layer opposite the first barrier layer.

17. A light emitting diode according to claim 15 wherein the ohmic layer comprises an ohmic and reflector layer.

18. A light emitting diode according to claim 15 wherein the first adhesion layer comprises titanium.

19. A light emitting diode according to claim 15 wherein the first barrier layer comprises platinum.

20. A light emitting diode according to claim 15 wherein the first bonding layer comprises gold.

21. A light emitting diode according to claim 15 wherein the ohmic layer comprises nickel/gold, nickel oxide/gold, nickel oxide/platinum, titanium and/or titanium/gold.

22. A light emitting diode according to claim 15 wherein the reflector layer comprises silver and/or aluminum.

23. A light emitting diode according to claim 15 wherein the second adhesion layer comprises titanium.

24. A light emitting diode according to claim 15 wherein the second barrier layer comprises platinum.

25. A light emitting diode according to claim 15 wherein the second bonding layer comprises gold.

26. A light emitting diode comprising;
a substrate having first and second opposing faces, the first face having smaller surface area than the second face;
a diode region on the second face;
a first layer comprising titanium on the first face opposite the diode region;
a second layer comprising platinum on the first layer opposite the substrate;
a third layer comprising gold on the second layer opposite the first layer;
a fourth layer comprising nickel/gold, nickel oxide/gold, nickel oxide/platinum, titanium and/or titanium/gold on the diode region opposite the substrate;
a fifth layer comprising silver and/or aluminum on the fourth layer opposite the diode region;
a sixth layer comprising titanium on the fifth layer opposite the fourth layer;
a seventh layer comprising platinum on the sixth layer opposite the fifth layer; and
an eighth layer comprising gold on the seventh layer opposite the sixth layer.

27. A light emitting diode according to claim 25 further comprising a mounting support on the third layer opposite the second layer.

28. A light emitting diode according to claim 1:
wherein the substrate comprises a compensated, colorless silicon carbide substrate having first and second opposing faces; and
wherein the diode region comprises a gallium nitride-based diode region on the second face that is configured to emit light into the substrate upon application of voltage across the diode region.

29. A light emitting diode according to claim 28 further comprising:
a mounting support on the diode region, opposite the substrate, the mounting support being configured to support the diode region such that the light that is emitted from the diode region into the substrate, is emitted from the substrate, upon application of voltage across the diode region.

30. A light emitting diode according to claim 28 further comprising:
a mounting support on the first face, opposite the diode region, the mounting support being configured to support the first face.

31. A light emitting diode according to claim 29 wherein the reflector layer is configured to reflect light that is emitted from the diode region back into the diode region, through the substrate and from the substrate, upon application of voltage across the diode region.

32. A light emitting diode according to claim 30 further comprising:
a reflector between the mounting support and the first face, that is configured to reflect light that is emitted from the first face back into the substrate, upon application of voltage across the diode region.

33. A light emitting diode according to claim 31 further comprising:
a transparent electrode between the diode region and the reflector.

34. A light emitting diode according to claim 32 further comprising a transparent electrode between the first face and the reflector.

35. A light emitting diode according to claim 31 wherein the reflector layer comprises a layer of at least one reflective metal.

36. A light emitting diode according to claim 33 wherein the transparent electrode comprises a layer of nickel/gold, nickel oxide/gold, nickel oxide/platinum, titanium and/or titanium/gold.

37. A light emitting diode according to claim 31:
wherein the second barrier layer comprises a barrier region between the reflector layer and the mounting support; and
wherein the second bonding layer comprises a bonding region between the barrier region and the mounting support.

38. A light emitting diode according to claim 32:
wherein the first barrier layer comprises a barrier region between the reflector and the mounting support; and
wherein the first bonding layer comprises a bonding region between the barrier region and the mounting support.

39. A light emitting diode according to claim 37 wherein the bonding region comprises gold, indium, solder and/or braze.

40. A light emitting diode according to claim 38 wherein the bonding region comprises gold, indium, solder and/or braze.

41. A light emitting diode according to claim 28 further comprising:
an optical element adjacent the first face, opposite the diode region.

42. A light emitting diode according to claim 28 wherein the first face of the substrate includes therein at least one groove that defines, in cross-section, a plurality of pedestals that extend into the substrate from the first face towards the second face.

43. A light emitting diode according to claim 42 wherein the pedestals are triangular pedestals.

44. A light emitting diode according to claim 42 wherein the grooves include tapered and/or curved sidewalls.

45. A light emitting diode according to claim 42 wherein the grooves include a beveled and/or curved floor.

46. A light emitting diode according to claim 44 wherein the grooves include a beveled and/or curved floor.

47. A light emitting diode according to claim 42 wherein the first and second faces of the substrate comprise square perimeters.

48. A light emitting diode according to claim 42 wherein the first face of the substrate comprises a textured surface.

49. A light emitting diode according to claim 28 wherein the first face of the substrate includes therein an array of via holes that defines, in cross-section, a plurality of pedestals that extend into the substrate from the first face towards the second face.

50. A light emitting diode according to claim 49 wherein the via holes include tapered and/or curved sidewalls.

51. A light emitting diode according to claim 49 wherein the via holes include a flat, beveled and/or curved floor.

52. A light emitting diode according to claim 50 wherein the via holes include a flat, beveled and/or curved floor.

53. A light emitting diode according to claim 49 wherein the first and second faces of the substrate comprise square perimeters.

54. A light emitting diode according to claim 49 wherein the first face of the substrate comprises a textured surface.

55. A light emitting diode according to claim 49 wherein the array of via holes comprises an array of tapered and/or curved via holes.

56. A light emitting diode according to claim 28 wherein the diode region comprises a peripheral portion, at least one central portion that is enclosed by the peripheral portion and at least one emission region that is confined to within the at least one central portion and does not extend onto the peripheral portion.

57. A light emitting diode according to claim 28 further comprising:
a plurality of emission regions on the diode region, a respective one of which is confined to within a respective one of the pedestals and does not extend beyond the respective one of the pedestals.

58. A light emitting diode according to claim 42 further comprising:
a plurality of electrodes on the diode region, a respective one of which is confined to within a respective one of the pedestals and does not extend beyond the respective one of the pedestals.

59. A light emitting diode according to claim 49 further comprising:
at least one electrode on the diode region that does not overlap the via holes.

60. A light emitting diode according to claim 1:
wherein the first face is patterned to define, in cross-section, a plurality of pedestals that extend into the substrate from the first face towards the second face.

61. A light emitting diode according to claim 60 further comprising:
a mounting support on the diode region, opposite the substrate, the mounting support being configured to support the diode region such that the light that is emitted from the diode region into the substrate is emitted from the plurality of pedestals, upon application of voltage across the diode region.

62. A light emitting diode according to claim 60 further comprising:
a mounting support on the first face, opposite the diode region, the mounting support being configured to support the first face.

63. A light emitting diode according to claim 61 wherein the reflector layer is configured to reflect light that is emitted from the diode region back into the diode region, through the substrate that is transparent to optical radiation in the predetermined wavelength range and from the plurality of pedestals, upon application of voltage across the diode region.

64. A light emitting diode according to claim 62 further comprising:
a reflector between the mounting support and the first face, that is configured to reflect light that is emitted from the first face back into the substrate, upon application of voltage across the diode region.

65. A light emitting diode according to claim 63 further comprising:
a transparent electrode between the diode region and the reflector.

66. A light emitting diode according to claim 64 further comprising a transparent electrode between the first face and the reflector.

67. A light emitting diode according to claim 63 wherein the reflector layer comprises a layer of at least one reflective metal.

68. A light emitting diode according to claim 65 wherein the transparent electrode comprises a layer of nickel/gold, nickel oxide/gold, nickel oxide/platinum, titanium and/or titanium/gold.

69. A light emitting diode according to claim 63: wherein the second barrier layer comprises a barrier region between the reflector layer and the mounting support; and
wherein the second bonding layer comprises a bonding region between the barrier region and the mounting support.

70. A light emitting diode according to claim 64:
wherein the first barrier layer comprises a barrier region between the reflector and the mounting support; and
wherein the first bonding layer comprises a bonding region between the barrier region and the mounting support.

71. A light emitting diode according to claim 69 wherein the bonding region comprises gold, indium, solder and/or braze.

72. A light emitting diode according to claim 70 wherein the bonding region comprises gold, indium, solder and/or braze.

73. A light emitting diode according to claim 60 further comprising:
an optical element adjacent the first face, opposite the diode region.

74. A light emitting diode according to claim 60 wherein the first face of the substrate includes therein at least one groove that defines, in cross-section, the plurality of pedestals in the substrate.

75. A light emitting diode according to claim 74 wherein the pedestals are triangular pedestals.

76. A light emitting diode according to claim 74 wherein the grooves include tapered and/or curved sidewalls.

77. A light emitting diode according to claim 74 wherein the grooves include a beveled and/or curved floor.

78. A light emitting diode according to claim 76 wherein the grooves include a beveled and/or curved floor.

79. A light emitting diode according to claim 74 wherein the first and second faces of the substrate comprise square perimeters.

80. A light emitting diode according to claim 74 wherein the first face of the substrate comprises a textured surface.

81. A light emitting diode according to claim 1 wherein the first face of the substrate includes therein an array of via holes that defines, in cross-section, the plurality of pedestals in the substrate.

82. A light emitting diode according to claim 81 wherein the via holes include tapered and/or curved sidewalls.

83. A light emitting diode according to claim 81 wherein the via holes include a flat, beveled and/or curved floor.

84. A light emitting diode according to claim 82 wherein the via holes include a flat, beveled and/or curved floor.

85. A light emitting diode according to claim 81 wherein the first and second faces of the substrate comprise square perimeters.

86. A light emitting diode according to claim 81 wherein the first face of the substrate comprises a textured surface.

87. A light emitting diode according to claim 81 wherein the array of via holes comprises an array of tapered and/or curved via holes.

88. A light emitting diode according to claim 60 wherein the diode region comprises a peripheral portion, at least one central portion that is enclosed by the peripheral portion and at least one emission region that is confined to within the at least one central portion and does not extend onto the peripheral portion.

89. A light emitting diode according to claim 60 further comprising:
a plurality of emission regions on the diode region, a respective one of which is confined to within a respective one of the pedestals and does not extend beyond the respective one of the pedestals.

90. A light emitting diode according to claim 74 further comprising:

a plurality of electrodes on the diode region, a respective one of which is confined to within a respective one of the pedestals and does not extend beyond the respective one of the pedestals.

91. A light emitting diode according to claim 81 further comprising:

at least one electrode on the diode region that does not overlap the via holes.

92. A light emitting diode according to claim 60, wherein the substrate comprises silicon carbide and wherein the diode region comprises gallium nitride.

93. A light emitting diode according to claim 60 wherein the first face has smaller surface area than the second face; and the diode region includes an emission region that is confined to within the smaller surface area of the first face.

94. A light emitting diode according to claim 93 wherein the emission region comprises a mesa.

95. A light emitting diode according to claim 93 wherein the first face of the substrate comprises a textured surface.

96. A light emitting diode according to claim further comprising a transparent electrode on at least a portion of the mesa.

97. A light emitting diode according to claim 93 wherein the substrate is a silicon carbide substrate that is transparent to optical radiation in a predetermined wavelength range and wherein the diode region is configured to emit light in the predetermined wavelength range.

98. A light emitting diode according to claim 1 wherein the first face has smaller surface area than the second face; the light emitting diode further comprising a mounting support on the diode region, opposite the substrate.

99. A light emitting diode according to claim 98 wherein the substrate is transparent to optical radiation in a predetermined wavelength range and wherein the diode region is configured to emit light in the predetermined wavelength range into the substrate that is transparent to the optical radiation in the predetermined wavelength range, upon application of voltage across the diode region.

100. A light emitting diode according to claim 99 wherein the mounting support is further configured to support the diode region such that the light that is emitted from the diode region into the substrate that is transparent to optical radiation in the predetermined wavelength range, is emitted from the first face, upon application of voltage across the diode region.

101. A light emitting diode according to claim 100 wherein the reflector layer is configured to reflect light that is emitted from the diode region back into the diode region, through the substrate that is transparent to optical radiation in the predetermined wavelength range and from the first face, upon application of voltage across the diode region.

102. A light emitting diode according to claim 101 further comprising:

a transparent electrode between the diode region and the reflector layer.

103. A light emitting diode according to claim 101 further comprising:

wherein the second barrier layer is between the reflector layer and the mounting support; and wherein the second bonding layer is between the barrier layer and the mounting support.

104. A light emitting diode according to claim 103 wherein the bonding region comprises gold, indium, solder and/or braze.

* * * * *

UNITED STATES PATENT AND TRADEMARK OFFICE
CERTIFICATE OF CORRECTION

PATENT NO. : 6,791,119 B2
DATED : September 14, 2004
INVENTOR(S) : Slater, Jr. et al.

It is certified that error appears in the above-identified patent and that said Letters Patent is hereby corrected as shown below:

Title page,
Item [56], References Cited, OTHER DOCUMENTS, should include:
-- U.S. Application Serial No. 60/411,980, filed 09/19/02, *Phosphor-Coated Light Emitting Diodes Including Tapered Sidewalls, and Fabrication Methods*

U.S. Application Serial No. 10/003,331, filed 10/31/01, *Low Temperature Formation of Backside Ohmic Contacts for Vertical Devices*

U.S. Application Serial No. 60/294,445, filed May 30, 2001, *Multi-Quantum Well Light Emitting Diode Structure*

U.S. Application Serial No. 60/294,378, filed May 30, 2001, *Light Emitting Diode Structure With Multi-Quantum Well and Superlattice Structure*

U.S. Application Serial No. 60/294,308, filed May 30, 2001, *Light Emitting Diode Structure With Superlattice Structure*

U.S. Application Serial No. 09/787,189, filed 03/15/01, *Low Temperature Formation of Backside Ohmic Contacts for Vertical Devices* --

Column 29,
Line 3, should read -- 90. A light emitting diode according to claim 76 further --
Line 27, should read -- 96. A light emitting diode according to claim 35 further --
Line 34, should read -- 98. A light emitting diode according to claim 3 wherein --

Signed and Sealed this

Fifth Day of April, 2005

JON W. DUDAS
*Director of the United States Patent and Trademark Office*